United States Patent [19]

Yoshikawa et al.

[11] Patent Number: 4,992,109

[45] Date of Patent: Feb. 12, 1991

[54] PHOTOELECTRIC CONVERSION ELEMENT

[75] Inventors: Masao Yoshikawa; Tetsuro Suzuki, both of Yokohama; Akio Kojima, Mitaka; Masayuki Shoshi, Yokohama; Masafumi Ohta, Susono, all of Japan

[73] Assignee: Ricoh Company, Ltd., Tokyo, Japan

[21] Appl. No.: 450,288

[22] Filed: Dec. 13, 1989

[30] Foreign Application Priority Data

Dec. 11, 1987 [JP] Japan .................. 62-312021
Dec. 11, 1987 [JP] Japan .................. 62-312022
Dec. 11, 1987 [JP] Japan .................. 62-312023
Feb. 24, 1988 [JP] Japan .................. 63-39635

[51] Int. Cl.$^5$ ............... H01L 31/06; H01L 31/0344
[52] U.S. Cl. ........................... 136/263; 357/8; 357/30; 250/211 J

[58] Field of Search ............... 136/263; 357/8, 30 J, 357/30 R; 250/211 J, 212

[56] References Cited

U.S. PATENT DOCUMENTS 3,057,947 10/1962 Calvin et al. ................. 136/263
4,672,149 6/1987 Yoshikawa et al. ........... 136/263

Primary Examiner—Aaron Weisstuch
Attorney, Agent, or Firm—Cooper & Dunham

[57] ABSTRACT

A photoelectric conversion element has a front electrode, a rear electrode and a photo-activatable layer sandwiched between these electrodes. The photo-activatable layer contains a compound selected from a group consisting of a triphenylamine compound, a diaminocarbazole compound, an oxazole compound, a thiazole compound, and 1,3-dithiol compound. The compound contained in the photo-activatable layer improves photoelectric conversion efficiency.

22 Claims, 1 Drawing Sheet

PHOTOELECTRIC CONVERSION ELEMENT

CROSS-REFERENCE APPLICATION:

The present application is a continuation-in-part of application Ser. No. 07/282,317 filed Dec. 9, 1988, now abandoned.

BACKGROUND OF THE INVENTION

The present invention relates to a photoelectric conversion element or a solar battery which makes use of an organic photoconductive material. The photoelectric conversion element of the present invention is suitable for use in, for example, sensors such as light sensors, image sensors and so forth.

Hitherto, various proposals and attempts have been made in regard to production of photoelectric conversion elements from inorganic semiconductor materials with an aim to obtain a photoelectric conversion element which is inexpensive but yet capable of performing photoelectric conversion with a high degree of efficiency.

For instance, it has been attempted to put various materials such as single-crystalline Si, polycrystalline Si, CdS, CdTe, GaAs and amorphous Si into practical use as materials of photoelectric conversion elements. These substances, however, cannot well meet the demand for inexpensive photoelectric conversion elements.

In order to obviate these shortcomings, in recent years, proposals have been made in regard to techniques for producing photoelectric conversion elements with organic semiconductor layers.

Examples of such semiconductor layers are:

(a) Spinner-applied merocyanine dye layer (disclosed in Japanese Pat. Application Laying Open Nos. 51-122389 and 53-131782, as well as in JOURNAL OF APPLIED PHYSICS 49, 5982 (1978) by A. K. Ghosh)

(b) Laminate of an electron donor layer such as of phthalocyanine or ovalen and an electron acceptor layer such as of a pyrylium-type dye (disclosed in Japanese Pat. Application Laying Open Nos. 54-27787 and 60-201672, as well as in JOURNAL OF APPLIED PHYSICS 52, 5218 (1981) by B. R. Loutfy)

(c) A eutectic complex layer generated from a pyrylium-type dye and polycarbonate (disclosed in Japanese Pat. Application Laying Open No. 54-27387)

(d) A layer composed of non-metal phthalocyanine dispersed in a binder (disclosed in Japanese Pat. Application Laying Open No. 55-9497)

(e) A laminate of an n-type silicon layer and a p-doped polyacetylene thin film (disclosed in Japanese Pat. Application Laying Open Nos. 55-130182 and 55-138879, as well as in JOURNAL OF APPLIED PHYSICS 38, 555 (1981) by B. R. Weinberger)

(f) Vacuum-evaporated merocyanine dye layer (disclosed in Japanese Pat. Application Laying Open No. 56-35477)

In the use of these organic semiconductor materials, one of such semiconductor materials alone or together with a suitable binder is dissolved or dispersed in a medium and the thus formed solution or dispersion is applied on a substrate. Alternatively, one of these semiconductor materials is vacuum-evaporated at a low temperature so as to form a deposition layer on the substrate and another conductive layer is formed on the deposition layer. Although these methods provide inexpensive photoelectric conversion elements of comparatively large areas, such elements are still unsatisfactory in that the conversion efficiency is impractically low.

SUMMARY OF THE INVENTION:

Accordingly, an object of the present invention is to provide a photoelectric conversion element which can be formed to have a large area with a low production cost and which has a flexibility despite the use of an organic material, as well as a better matching to spectral distributions of solar and artificial illumination lights as compared with conventional elements, thereby obviating the above-described problems of the prior art.

In order to achieve the above object, the inventors have made an intense study with an aim to overcome such problems that the organic semiconductor layers obtained by the above-mentioned methods of (a) to (f) show when an organic semiconductor capable of generating photocarriers upon receiving visible light is used solely or together with a suitable binder. As a result, the inventors have found that a photoelectric conversion element having a light-transmitting front electrode, a photo-activatable layer containing a specific compound, and a rear electrode exhibits a drastic increase of the photo-electric current and, hence, a very high photoelectric conversion efficiency.

The object of the present invention is attained by a photoelectric conversion element comprising a light-permeable front electrode, a photo-activatable layer disposed on one surface of said front electrode, and a rear electrode disposed on one surface of said photo-activatable layer which is opposite to the other surface of said photo-activatable layer facing said front electrode, wherein said photo-activatable, layer contains a compound selected from the group consisting of a triphenylamine compound represented by the following general formula (I), a diaminocarbazole compound represented by the following general formula (II), a compound represented by the following general formula (III), and a 1,3-dithiol compound represented by the following general formula (IV):

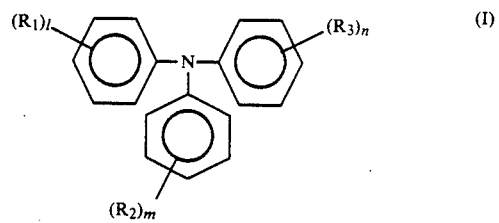

where, $R_1$, $R_2$, and $R_3$ each represent a halogen atom, a nitro group, a cyano group, a substituted or non-substituted alkyl group, a substituted or non-substituted alkoxy group, a substituted or non-substituted aryl group, a substituted or non-substituted phenoxy group or a substituted or non-substituted amino group, wherein suffixes l, m and n represent an integer which is 0, 1, 2 or 3;

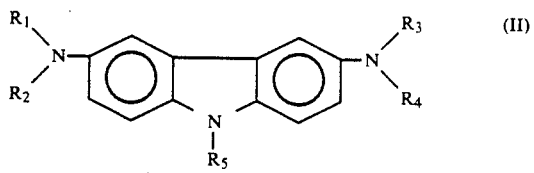

where, $R_1$, $R_2$, $R_3$, $R_4$ and $R_5$ each represent a hydrogen atom, a substituted or non-substituted alkyl group or a substituted or non-substituted aryl group, wherein $R_1$, $R_2$, $R_3$, $R_4$ and $R_5$ may be the same as or different from one another;

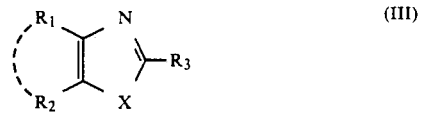 (III)

where, $R_1$, $R_2$ and $R_3$ each represent a hydrogen atom, a substituted or non-substituted saturated or unsaturated alkyl group, a substituted or non-substituted alkoxy group, a substituted or non-substituted aryl group or a substituted or non-substituted heterocyclic ring group, wherein $R_1$ and $R_2$ may form a ring, and X represents a sulfur atom or an oxygen atom; and

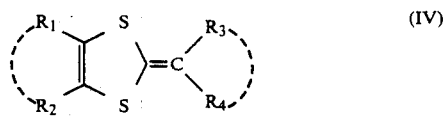 (IV)

where, $R_1$, $R_2$, $R_3$ and $R_4$ each represent a hydrogen atom, a halogen atom, a cyano group, a nitro group, a substituted or non-substituted alkyl group which is saturated or unsaturated, a substituted or non-substituted alkoxy group, substituted or non-substituted aryl group, or a substituted or non-substituted heterocyclic ring group, wherein $R_1$ and $R_2$, and $R_3$ and $R_4$ respectively may form rings.

By virtue of the above-mentioned specific compound added to the photo-activatable layer, the photoelectric conversion element of the present invention produces a large photo-electric current and it becomes possible to produce a photoelectric conversion element of a large area with a reduced cost.

In consequence, the present invention makes it possible to effectively utilize photoconductive organic semiconductor materials which hitherto have not been usable due to generation of too small photoelectric current when used alone or in the form of a mixture with a binder, whereby the material of the photoelectric conversion element can have a wider selection.

These and other objects, features and advantages of the present invention will become clear from the following description of the preferred embodiments when the same is read in conjunction with the accompanying drawings.

BRIEF DESCRIPTION OF THE DRAWINGS:

FIG. 2a is a sectional view of a photoelectric conversion element of the present invention having a support on the front electrode of the photoelectric conversion element shown in FIG. 1a;

FIG. 3a is a sectional view of a photoelectric conversion element of the present invention in which supports are disposed both on the front electrode and the rear electrode of the photoelectric conversion element of FIG. 1a.

DESCRIPTION OF THE PREFERRED EMBODIMENTS:

In a preferred form of the photoelectric conversion element of the present invention, a photo-activatable layer 2 which contains a compound selected from a group consisting of the compounds expressed by the aforementioned general formulae (I) to (IV) is sandwiched between a pair of electrodes, i.e., a front electrode 1 and a rear electrode 4.

The front electrode 1 is the electrode disposed on the light-incident side of the element and, hence, is adapted to transmit light.

Figure 1A:
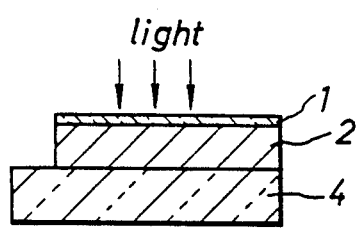
FIG. 1a is a sectional view of a photoelectric conversion element of the present invention having a single photo-activatable layer.
Figure 1B:
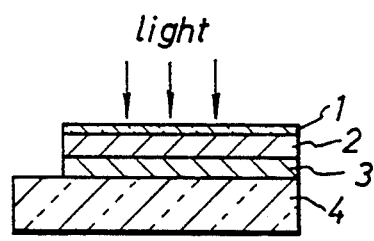
FIG. 1b is a sectional view of a photoelectric conversion element of the present invention having a pair of photo-activatable layers.

Each of the front electrode 1 and the rear electrode 4 may be used alone or in combination with a suitable support or a protective layer. FIGS. 1a and 1b show examples in which the electrodes are used alone, while FIGS. 2a, 2b, 3a and 3b show examples in which the electrodes are used in combination with a support or a protective layer.

In the practical use of the photoelectric conversion element, the front electrode 1 and the rear electrode 4 are connected to an external circuit through leads.

Figure 2A:
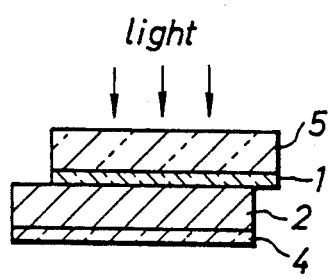
Figure 2B:
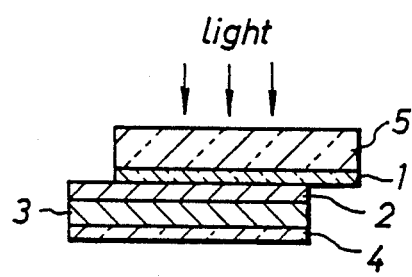
FIG. 2b is a sectional view of a modification of the photoelectric conversion element of FIG. 2a in which the photo-activatable layer is composed of two layers.
Figure 3A:
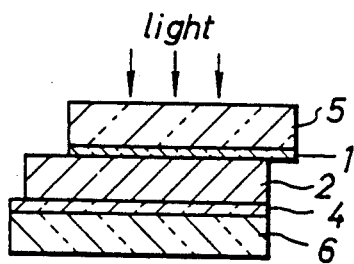
Figure 3B:
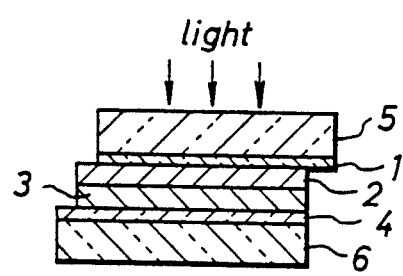
FIG. 3b is a sectional view of a modification of the photoelectric conversion element of FIG. 3a in which the photo-activatable, layer is composed of two layers.

The photo-activatable layer need not always be a single-layered structure but may have a laminated structure composed of two layers. FIGS. 1b, 2b and 3b show examples in which the respective photo-activatable layers are composed of two layers.

The photo-activatable layer 3 may be a layer which generates electric charges upon irradiation with light as with the photo-activatable layer 2, or may be a layer which is capable of efficiently moving the electric charges generated in the photo-activatable layer 2. In the embodiment shown in FIG. 1b, the photo-activatable layer 2 is illustrated as positioned adjacent to the front electrode 1. This, however, is only illustrative and the arrangement may be such that the photo-activatable layer 3 is disposed adjacent to the front electrode 1. It is also to be understood that the photo-activatable layer 2 is composed of a plurality of layers made of different photoconductive organic materials.

The present invention is concerned with the photo-activatable layer 2.

The photo-activatable layer 2 is a layer which can produce holes and electrons upon irradiation with light. To this end, it is essential that an electric field resides in the photo-activatable, layer 2. The electric field may be produced by externally applying a suitable level of voltage between the front electrode 1 and the rear electrode 4. The electric field also may be established without the aid of any external voltage. For instance, the electric field can be produced by using metals of different work function values as the materials of the front electrode 1 and the rear electrode 4. It is also possible to arrange such that, when the photo-activatable layer 2 contacts the front electrode 1, rear electrode 4 or the photo-activatable layer 3, thermal carriers are caused to move due to difference in the Fermi level (or work function) to form a junction barrier.

The photo-activatable layer 2 is a layer which contains a compound selected from a group consisting of compounds represented by the aforementioned general formulae (I) to (IV). This layer also contains, as another essential component, a photoconductive organic semiconductor material capable of absorbing visible light and may further contain, as required, a suitable binder.

The inventors have found that the presence of a compound selected from a group consisting of the compounds represented by general formulae (I) to (IV) causes a remarkable increase in the photoelectric current produced in the photo-activatable layer 2 under irradiation with light and, a remarkable increase in the photoelectric conversion efficiency, as compared with the case where the above-mentioned compound does not exist in the photo-activatable layer 2.

The term "photoelectric conversion element" is used throughout the specification to generally mean an element of the type shown in FIGS. 1a, 2a and 3a and FIGS. 1b, 2b and 3b, in which an electromotive force or a current or both of them are generated when the element is irradiated with light without applying any external voltage between the front electrode 1 and the rear electrode 4 and, under an external voltage applied between both electrodes, a large photoelectric current is derived from the element.

As stated before, the photo-activatable layer 2 contains, as an essential component thereof, a compound selected from the group consisting of the compounds represented by the formulae (I) to (IV) and a photoconductive organic semiconductor material capable of absorbing a visible light.

In general, each of the compounds of the type generally expressed by the formulae (I) to (IV) tends to be highly dissolved uniformly in other components such as an organic semiconductor and a binder without being crystallized therewith. In addition, such a compound exhibits a small ionization potential and a high hole mobility in organic compounds.

The compositions of the photo-activatable layer 2 are shown below.

When a compound of the formula (I) is used in the photo-activatable layer 2, the photo-activatable layer 2 has a composition which contains 5 to 50 wt% of triphenylamine compound, 30 to 90 wt% of photoconductive organic semiconductor material capable of absorbing visible light, and 0 to 50 wt% of a binder. Preferably, the contents of the triphenylamine compound, photoconductive organic semiconductor and binder are 10 to 40 wt%, 40 to 70 wt% and 10 to 40 wt%, respectively.

When a compound of the formula (II) is used in the photo-activatable, layer 2, the photo-activatable layer 2 has a composition which contains 5 to 50 wt% of diaminocarbazole derivative, 30 to 90 wt% of photoconductive organic semiconductor material capable of absorbing visible light, and 0 to 50 wt% of a binder. Preferably, the contents of the diaminocarbazole compound, photoconductive organic semiconductor and binder are 10 to 40 wt%, 40 to 70 wt% and 10 to 40 wt%, respectively.

When a compound of the formula (III) is used in the photo-activatable layer 2, the photo-activatable layer 2 has a composition which contains 5 to 50 wt% of the compound of the general formula (IV), 30 to 90 wt% of photoconductive organic semiconductor material capable of absorbing visible light, and 0 to 50 wt% of a binder. Preferably, the contents of the compound of the general formula (III), the photoconductive organic semiconductor and the binder are 10 to 40 wt%, 40 to 70 wt% and 10 to 40 wt%, respectively.

When a compound of the formula (IV) is used in the photo-activatable layer 2, the photo-activatable, layer 2 has a composition which contains 5 to 60 wt% of 1,3-dithiol compound, 20 to 90 wt% of photoconductive organic semiconductor material capable of absorbing visible light (referred to as light-absorptive photoconductive organic semiconductor material, hereinafter), and 0 to 50 wt% of a binder. Preferably, the contents of the 1,3-dithiol compound, light-absorptive photoconductive organic semiconductor material, and binder are 10 to 50 wt%, 40 to 70 wt% and 10 to 40 wt%, respectively.

When the proportion of the compound represented by the general formulae (I) to (IV) in the photo-activatable layer 2 decreases, the effect of addition of the compound is reduced. Conversely, when the proportion of the compound increases, the concentration of the light-absorptive photoconductive organic semiconductor material in the layer 2 becomes relatively low, whereby the amount of absorption of light in the photo-activatable layer is reduced.

A smaller proportion of the light-absorptive photoconductive organic semiconductor material in the photo-activatable layer causes the light absorbance of the layer 2 to be reduced. Conversely, when the proportion of the light-absorptive photoconductive organic semiconductor material in the photo activatable layer becomes larger, the concentration of the compound in the photo-activatable layer is relatively reduced, to thereby reduce the effect of addition of the compound.

A small content of the binder in the photo-activatable layer increases the probability of crystallization of the added compound. Conversely, a large binder content in the photo-activatable, layer reduces the amount of the component which contributes to the generation of photoelectric charges and movement of the same, resulting in a lower photoelectric conversion efficiency.

The thickness of the photo-activatable layer preferably ranges between 0.01 and 10 $\mu$m and more preferably between 0.05 and 3 $\mu$m, although the optimum thickness varies according to the type of the photoconductive organic semiconductor material or the type of the binder. A too small thickness causes the light absorption to be reduced and increases the tendency of generation of pin-holes between the front electrode 1 and the rear electrode 4. A too large thickness of the photo-activatable layer increases the distance in which either the holes or electrons have to move to the electrodes, so that the probability of de-activation of the holes or electrons before reaching the electrodes is increased, resulting in a reduced photoelectric conversion efficiency.

The above organic semiconductor material is mixed in a suitable medium together with a resin as required. When the organic semiconductor material is a pigment, the material is crushed by means of, for example, a ball mill so as to become a uniform slurry or, alternatively, the pigment is dissolved in a solvent such as an organic amine. Then, one of the compounds selected from the group consisting of the compounds expressed by the general formulae (I) to (IV) is added to the solution or the slurry, and the thus formed mixture is applied to the surface of the rear electrode 4, the surface of the rear electrode 4 on the support 6 or the surface of the front electrode 1 on the support 5 so as to form the photo-activatable layer.

The photo-activatable layer thus formed exhibits an open voltage (Voc) slightly higher than that obtained when the compound selected from the group consisting of the compounds expressed by the general formulae (I) to (IV) is omitted. In addition, the short-circuit current (Jsc) is remarkably increased as compared with the case where the above-mentioned compound is omitted. The conversion efficiency is determined by the following formula:

$$\eta = 100 \times \frac{Voc \times Jsc \times ff}{Pin}$$

where Pin represents the incident light energy, and ff represents the fill factor.

The photoelectric conversion element according to the present invention exhibits a high conversion efficiency as compared with photoelectric conversion elements which are devoid of the compound selected from the group consisting of the compounds represented by the general formulae (I) to (IV), the reasons of which will be explained below.

Namely, each of the compounds selected from the group of compounds of the formulae (I) to (IV), though it is an organic material, exhibits a low ionization potential, so that the holes of the photoelectric charges generated as a result of light absorption can easily be injected into this compound. In addition, each of the compounds also has high mobility of the holes. As a result, the probability of recombination between the holes and electrons is reduced and the efficiency of movement of the holes is increased, as compared with the photoelectric conversion which are devoid of the compound selected from the compounds represented by the general formulae (I) to (IV).

It will also be understood that a large photoelectric current can be obtained when a voltage is applied externally, and that consequently a photoelectric conversion element having a high sensitivity is obtained.

Triphenylamine compounds used in the present invention are represented by the following general formula (I).

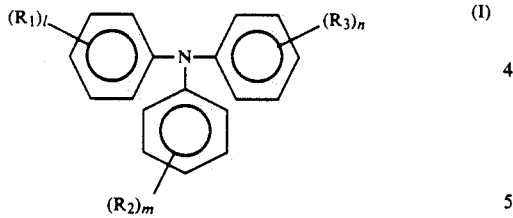
(I)

where, $R_1$, $R_2$, and $R_3$ each represent a halogen atom, a nitro group, a cyano group, a substituted or non-substituted alkyl group, a substituted or non-substituted alkoxy group, a substituted or non-substituted aryl group, a substituted or non-substituted phenoxy group or a substituted or non-substituted amino group, wherein suffixes l, m and n represent respectively an integer which is 0, 1, 1 or 3.

The following compounds are practical examples of the compound represented by the general formula (I).

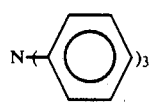

-continued

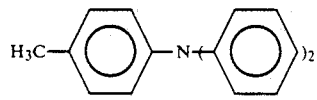

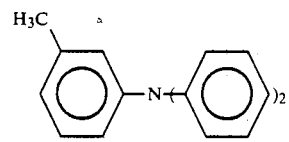

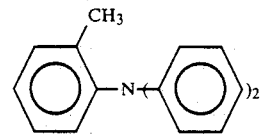

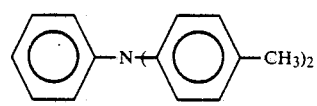

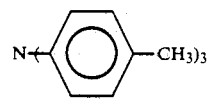

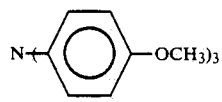

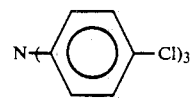

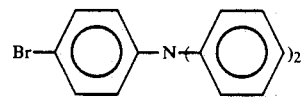

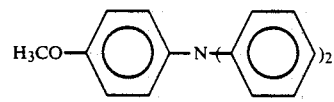

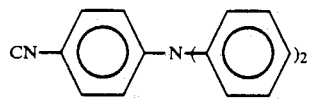

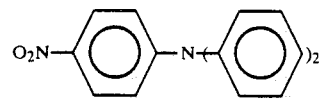

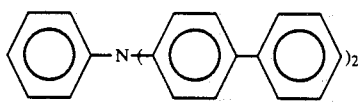

-continued

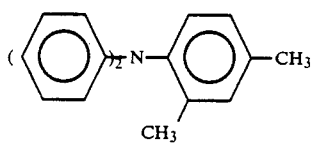
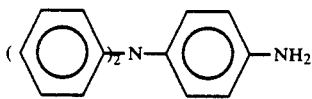
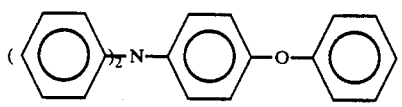
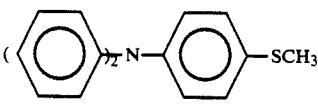
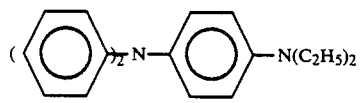

-continued

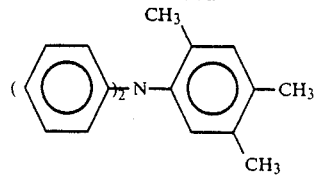

Diaminocarbazole compounds used in the present invention are represented by the following general formula (II).

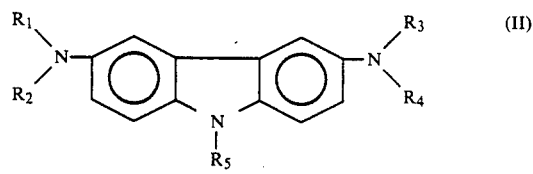

where, $R_1$, $R_2$, $R_3$, $R_4$ and $R_5$ each represent a hydrogen atom, a substituted or non-substituted alkyl group or a substituted or non-substituted aryl group, wherein $R_1$, $R_2$, $R_3$ and $R_4$ may be the same as or different from one another.

Examples of the compounds represented by the general formula (II) are shown below.

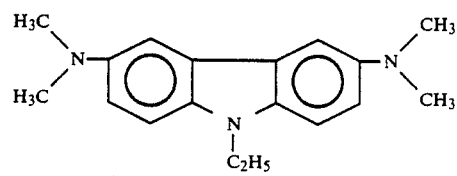
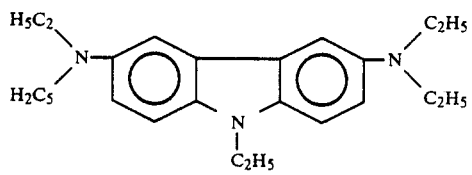
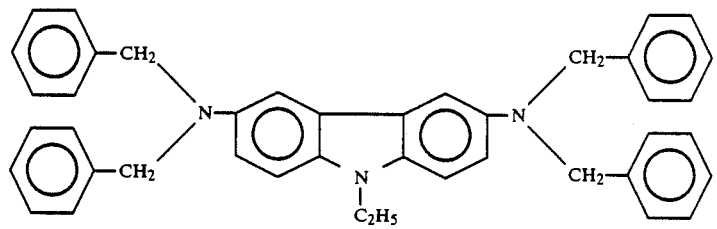
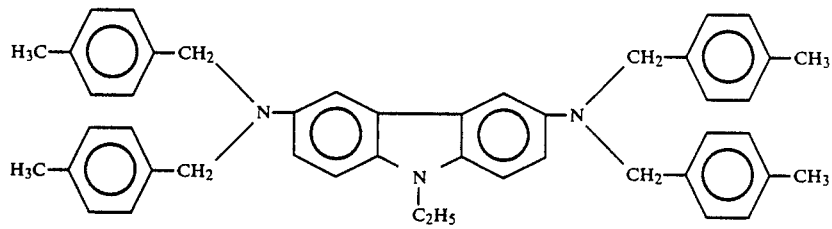

-continued

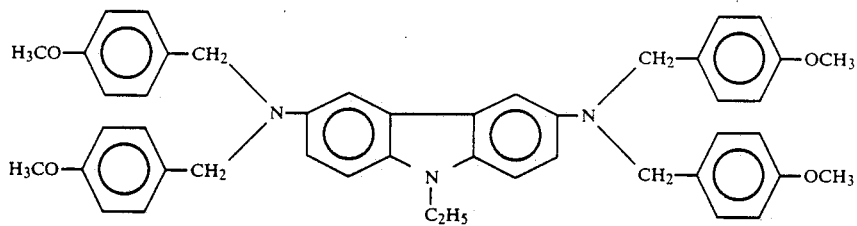

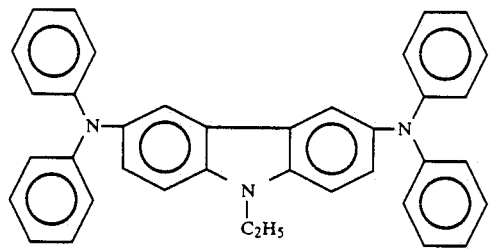

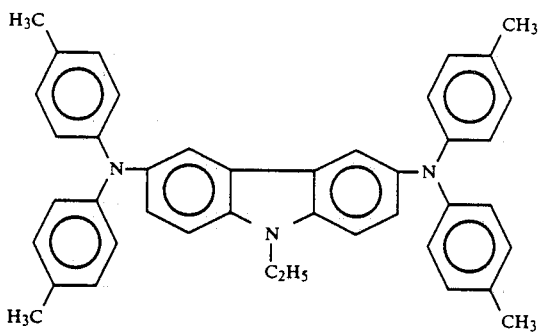

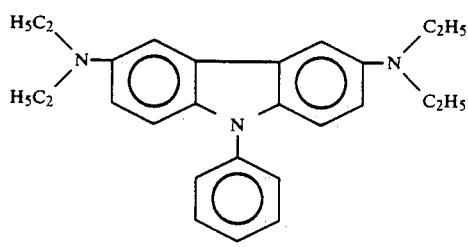

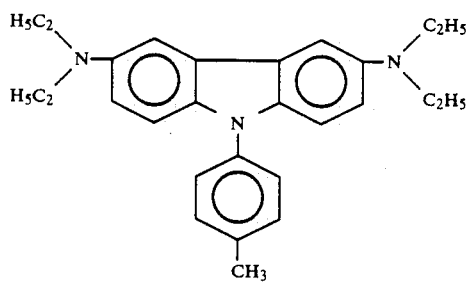

The compound used in the present invention is represented by the following general formula (III).

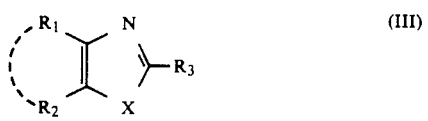

(III)

where, $R_1$, $R_2$ and $R_3$ each represent a hydrogen atom, a substituted or non-substituted alkyl group which is saturated or unsaturated, a substituted or non-substituted alkoxy group, a substituted or non-substituted aryl group or a substituted or non-substituted heterocyclic ring group and, $R_1$ and $R_2$ may form a ring, wherein a symbol X represents a sulfur atom or an oxygen atom.

Examples of compounds represented by the general formula (III) are shown below.

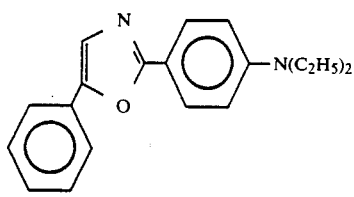
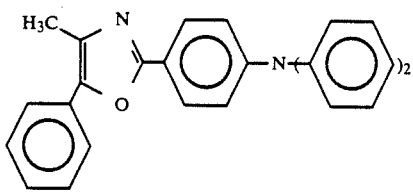
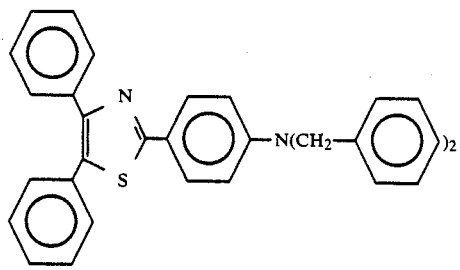
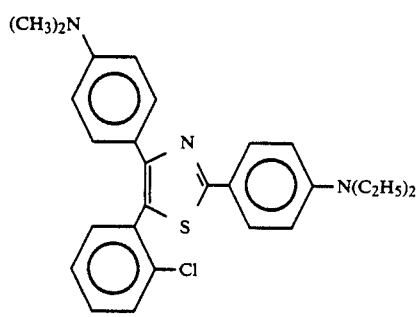
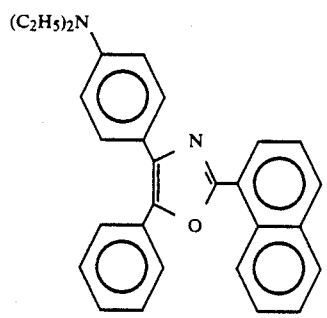
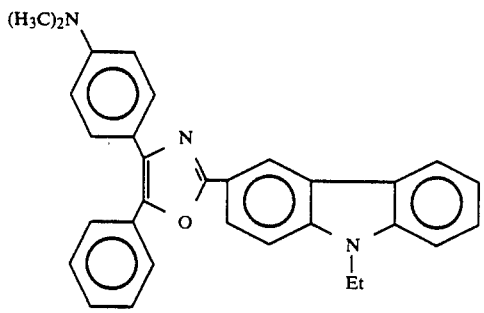

-continued
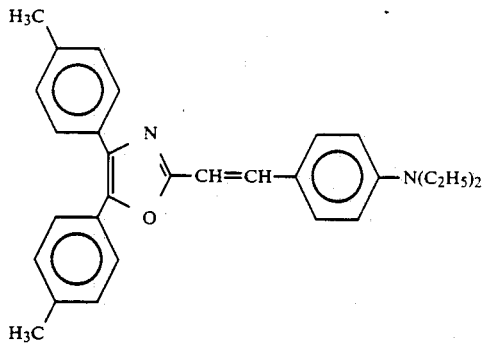
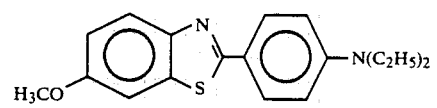
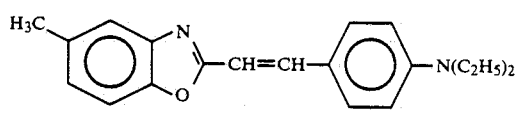
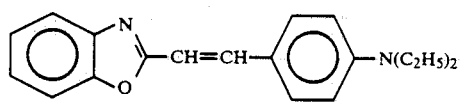
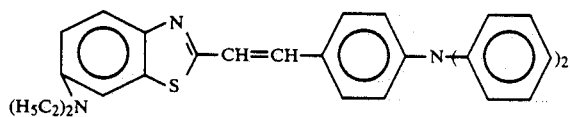
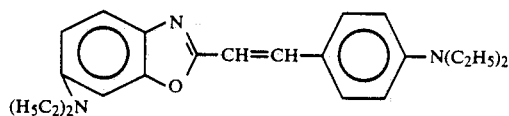
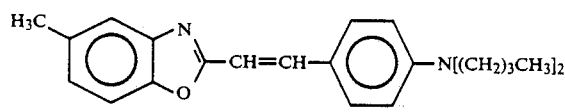
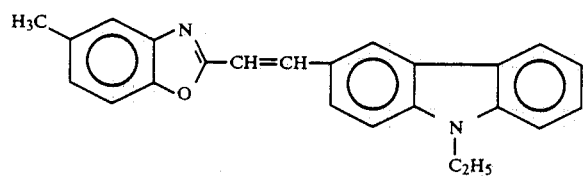
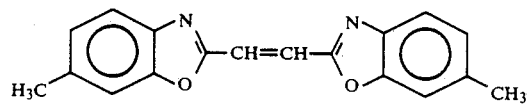
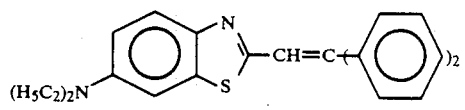

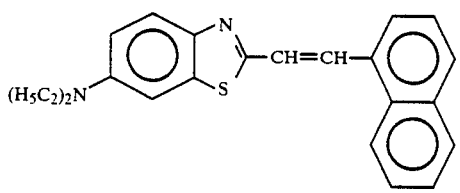

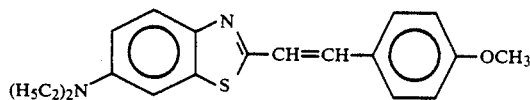

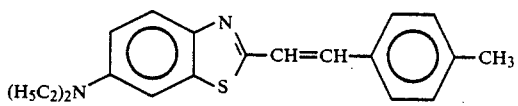

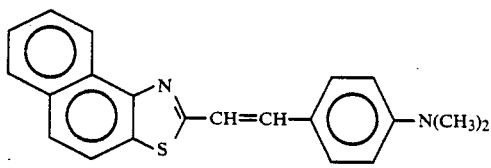

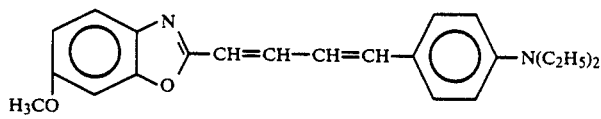

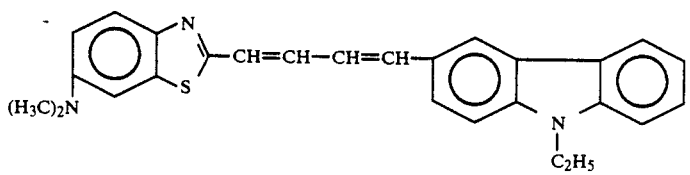

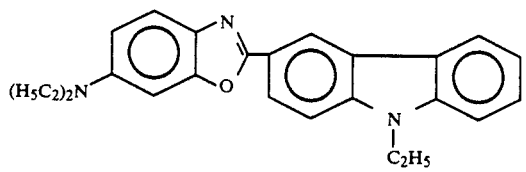

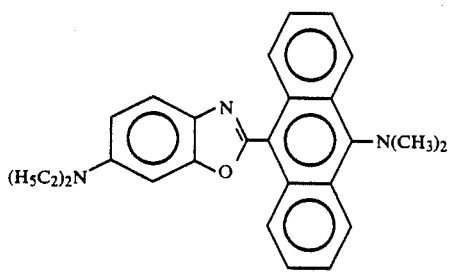

1,3 dithiol compounds used in the present invention are generally represented by the following formula (IV).

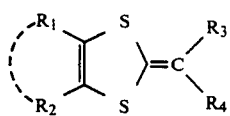

(IV)

where, $R_1$, $R_2$, $R_3$ and $R_4$ each represent a hydrogen atom, a halogen atom, a cyano group, a nitro group, a substituted or non-substituted alkyl group which is saturated or unsaturated, a substituted or non-substituted alkoxy group, a substituted or non-substituted aryl group, or a substituted or non-substituted heterocyclic ring group, wherein $R_1$ and $R_2$, and $R_3$ and $R_4$ respectively may form rings.

Examples of compounds represented by the general formula (IV) are shown below.
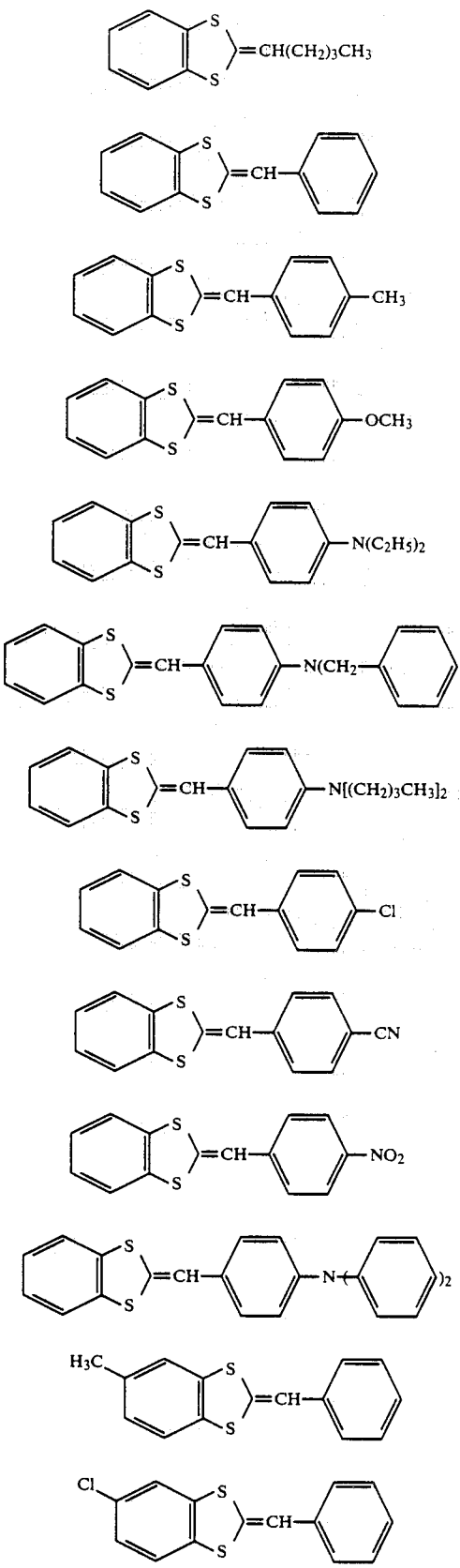

-continued
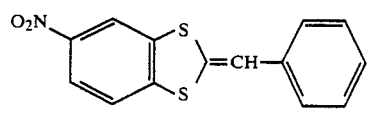
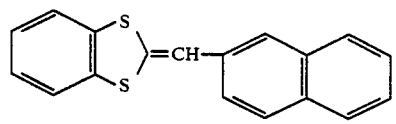
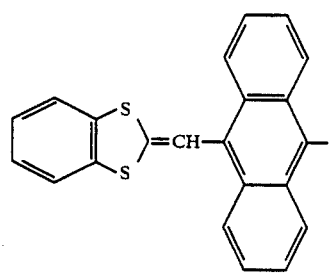
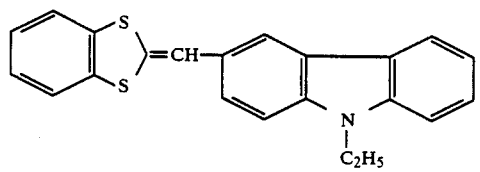
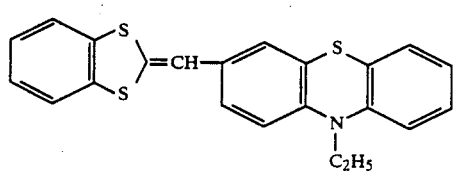
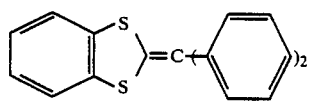
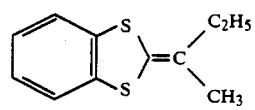
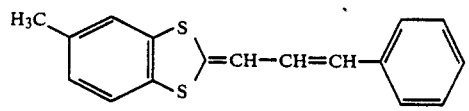
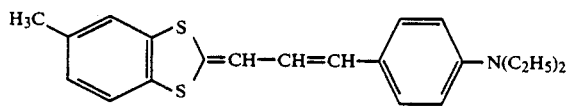
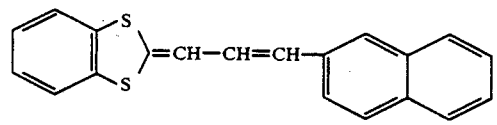

-continued
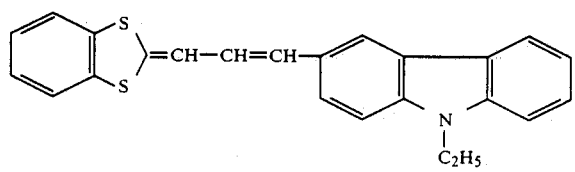
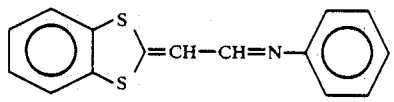
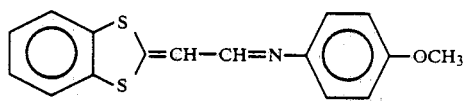
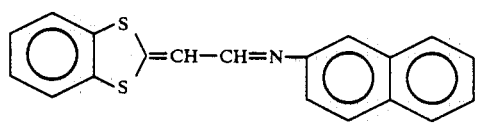
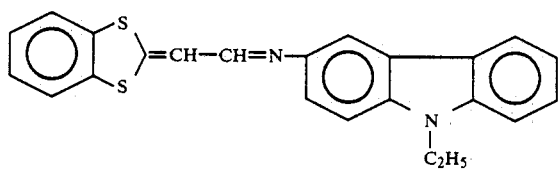
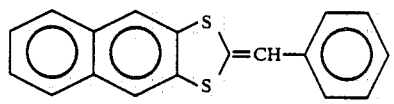
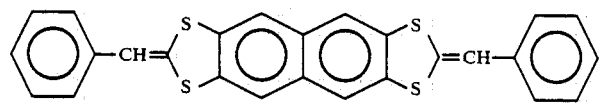
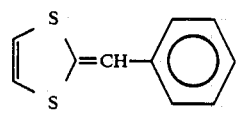
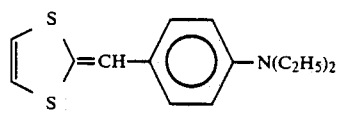
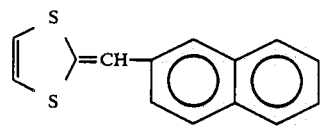
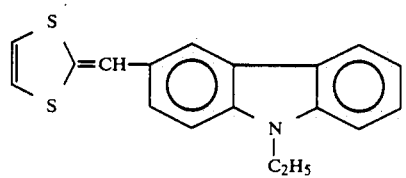
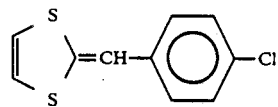

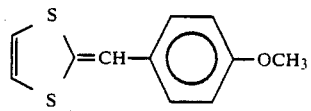
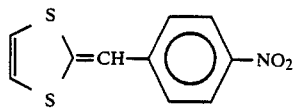
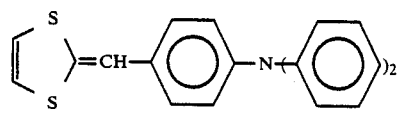
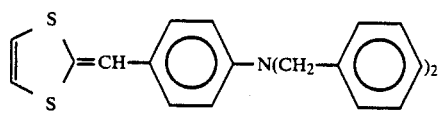
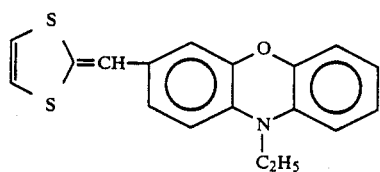
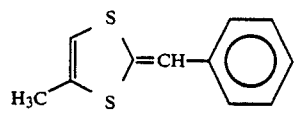
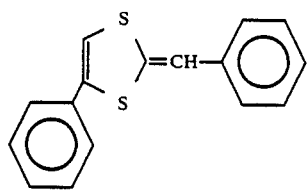
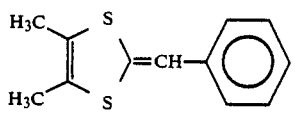
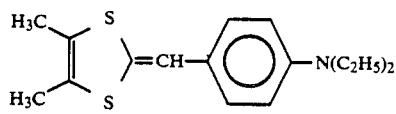
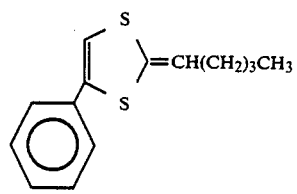
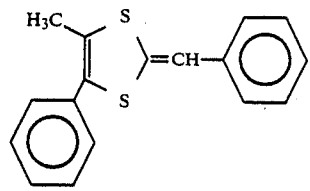

-continued
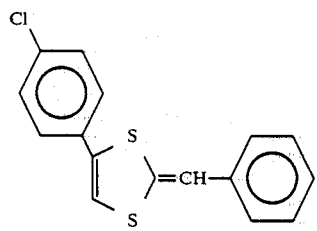
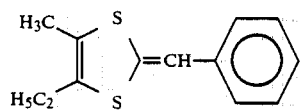
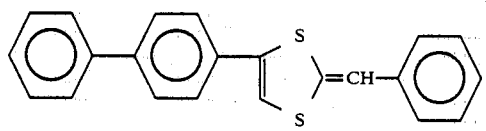
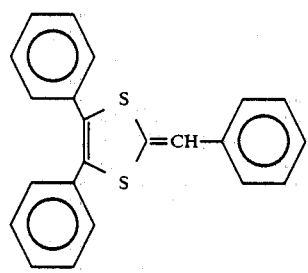
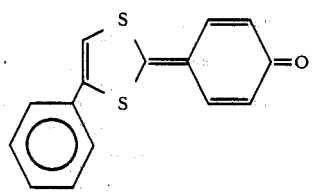
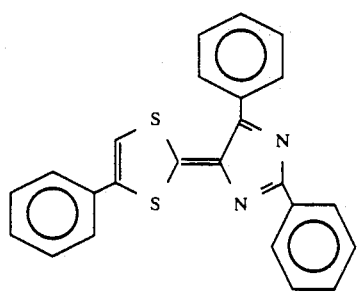
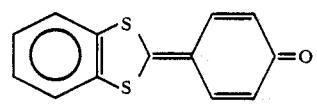
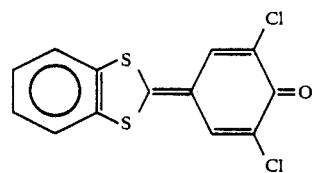

-continued
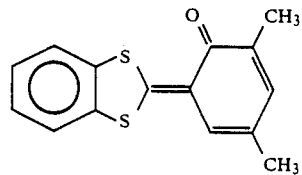
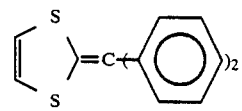
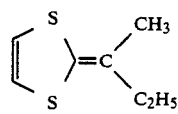
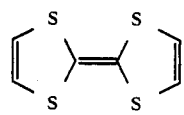
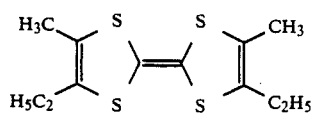
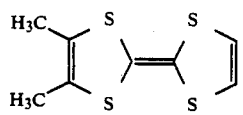
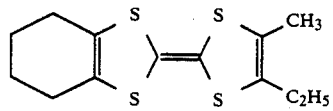
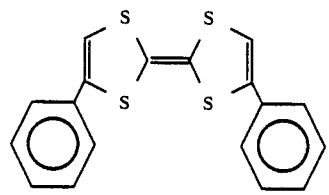
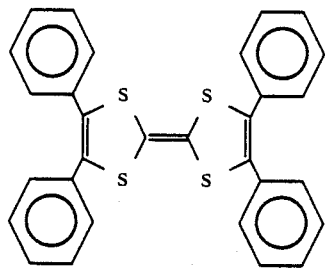
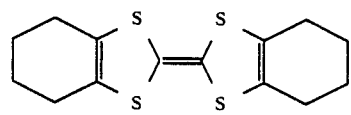
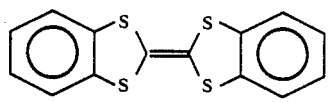

-continued

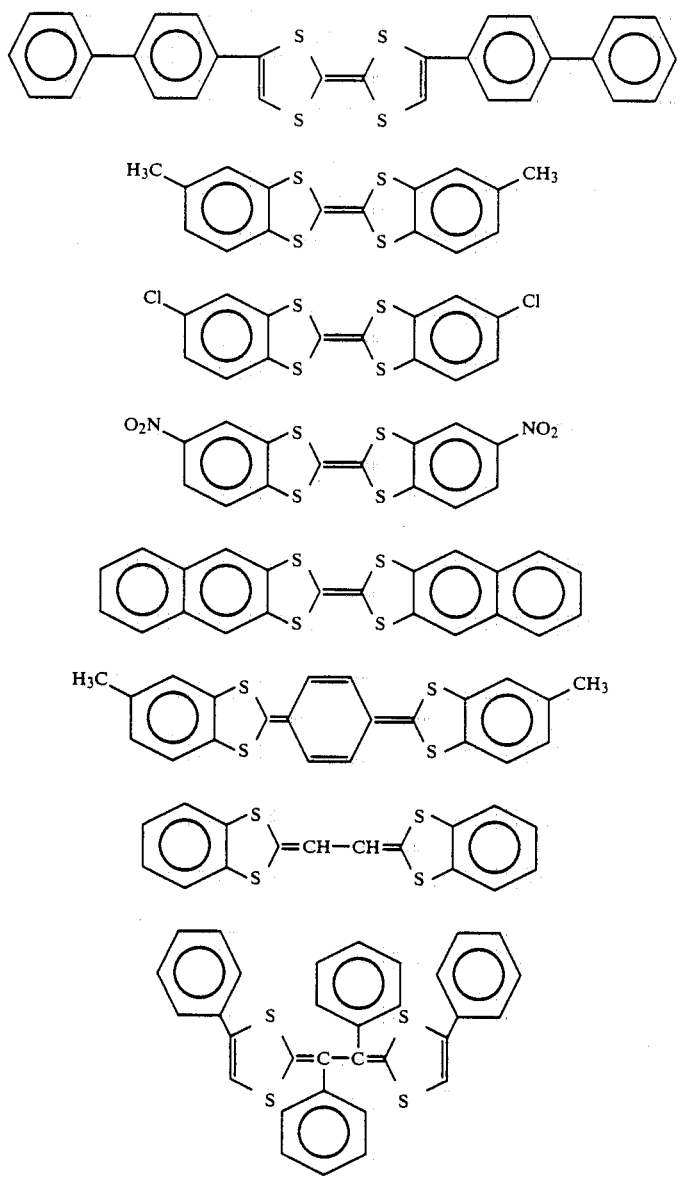

The front electrode 1 may be formed from a translucent metal such as aluminum, lead, zinc, tantalum, nickel, titanium, cobalt, niobium, copper, Hastelloy C, gold, platinum, silver, palladium or the like. A metal oxide such as tin oxide, ITO or the like also can be used as the material of the front electrode 1. The support 5 for the front electrode 1 may be formed from a glass sheet, a transparent plastic sheet or the like.

Almost all metals are usable as the material of the rear electrode 4. The support 6 for the rear electrode 4 may be formed from a glass sheet, a transparent plastic sheet or the like.

The photo-activatable layer 3 is (a) a layer containing another charge-generating organic semiconductor material for the purpose of compensation for reduction of photosensitivity of the pigment used in the photo-activatable, layer 2 in a certain wavelength region, (b) a layer which forms a junction barrier between itself and the photo-activatable, layer 2, or (c) a layer which enables holes or electrons generated in the photo-activatable layer 2 to move effectively.

The layer (a) produces a high compensation effect particularly when the layer (a) is formed of the light absorptive semiconductor material which is mentioned in a later description of the photo-activatable layer 2 and has a color tone which is complementary to the color tone of the photo-activatable, layer 2. The layer (a) can be formed by an application in the same manner as in the case of the photo-activatable layer 2.

The layer (b) can be formed by dispersing, in a binder resin, fine particles such as of zinc oxide, titanium oxide, cadmium sulfide, crystal of selenium, lead oxide or the like.

The layer (c) can be formed by mixing the compound which is represented by the formulae (I) to (IV) and used in the photo-activatable layer 2 (hereinafter referred to as an additive compound) or an electron donor having an Ip value lower than that of the additive compound with a suitable resin.

The following substances are usable as the light absorptive organic semiconductor material which is an essential component in the present invention: azo pigments such as dis-azo pigment and tris-azo pigment, other pigments such as phthalocyanine pigments, quinacridone pigments, perylene pigments, aromatic polycyclic quinone pigments, indigo pigments and thio-indigo pigments, and dyestuffs such as triphenyl methane dyestuffs, cyanine dyestuffs and merocyanine dyestuffs.

Examples of resins suitably used as the binder in the present invention are polyester resin, polycarbonate resin, polyamide resin, polyurethane resin, epoxy resin, alkyd resin, phenol resin, melamine resin, acrylic resin, cellulose resin, vinyl acetate resin, vinlyl chloride resin, vinylidene chloride resin, vinylidene fluoride resin, butyral resin, polyvinyl carbazole resin, polystyrene resin, polyimide resin, polyacrylonitrile resin, vinyl chloridevinyl acetate copolymer, vinylidene chloride-acrylonitrile copolymer, styrene-maleic anhydride copolymer, styrenebutadiene copolymer, ethyl cellulose and the like.

Examples of the construction of the photoelectric conversion element of the present invention are shown in FIGS. 1a, 2a and 3a and FIGS. 1b, 2b and 3b. FIGS. 1b, 2b and 3b show the constructions of modifications in which second photo-activatable layers are respectively added to the photo-activatable layers of the examples shown in FIGS. 1a, 2a and 3a.

The constructions shown in these Figures, however, are only illustrative and various further modifications and changes may be effected in accordance with uses.

Although some examples of the photoelectric conversion element of the present invention are shown below, it is to be understood that these examples are not intended for limiting the scope of the invention.

EXAMPLE 1

0.8 g of an azo pigment having a chemical structure represented by the following formula was mixed with 8 g of a 5% tetrahydrofuran solution of a butyral resin (XYHL produced by UCC) and the mixture was subjected to ball milling conducted for 3 days. Then, tetrahydrofuran was added to the mixture so that a 5 wt% solution of the azo pigment was prepared.

A glass substrate provided with a layer of tin oxide doped with indium (referred to as "ITO" hereinafter) was dipped in the application liquid and raised at a speed of 2 mm/sec, whereby a coating layer was formed on the ITO substrate. A translucent aluminum layer was formed by vacuum evaporation on the coating layer such that the aluminum layer exhibits a light transmittance of about 6.1% at 580 nm. Then, fine copper wires were connected to the ITO substrate and the aluminum layer by means of a silver paste, whereby a sample was obtained.

Monochromatic light having a wavelength of 580 nm was applied to the A1 electrode of the sample such that light quantity Pin of 1.54 $\mu w/cm^2$ reaches the pigment dispersed layer, while a lamp wave swept at a rate of 6 mv/sec was applied between both electrodes, and electric current-voltage characteristic of the sample was measured to obtain the following results.

$V_{oc} = 1.00$ V $J_{sc} = 71.4$ $nA/cm^2$ $ff = 0.22$

The photoelectric conversion efficiency ($\eta$) at 580 nm which was obtained after correction for the transmittance of the A1 electrode was 1.02% with respect to the sample.

EXAMPLE 2

A sample was prepared in the same manner as in Example 1 while using the same components except that the additive compound used in Example 1 was substituted by the additive compound represented by the following formula. While applying a monochromatic light of 580 nm to the sample from the side of the A1 electrode (Pin' = 1.55 $\mu w/cm^2$), the photoelectric conversion efficiency of the sample was measured in the same manner as in Example 1 to obtain the following results.

$V_{oc} = 0.98$ V $J_{sc} = 61.9$ $nA/cm^2$

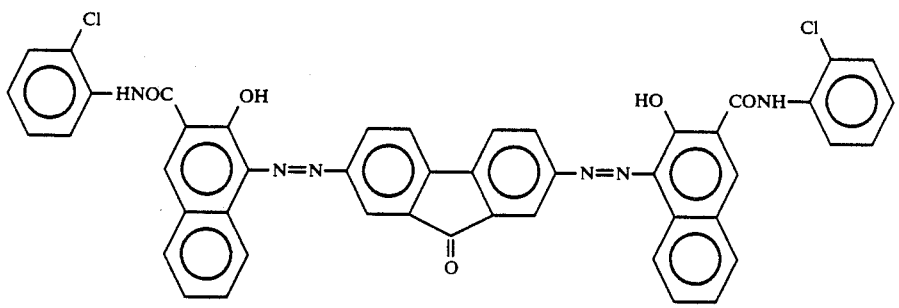

To this solution, an additive compound having a construction represented by the following formula was added in the same weight as that of the pigment, and the mixture was stirred to prepare an application liquid.

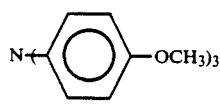

$ff = 0.23$ $\eta = 0.90\%$

Additive Compound

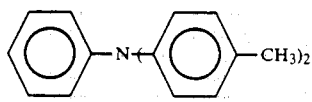

COMPARISON EXAMPLE 1

A sample was prepared in the same manner as in Example 1 except that the additive compound used in Example 1 was omitted. Under irradiation with a monochromatic light of 580 nm through the ITO electrode (Pin'=1.45 μw/cm$^2$), photoelectric conversion efficiency of the sample was measured in the same manner as in Example 1 to obtain the following results.

Voc=0.74 V

Jsc=2.50 nA/cm$^2$ ff=0.22

$\eta$=0.026%

EXAMPLE 3

A sample was prepared in the same manner as in Example 1 except that the additive compound used in Example 1 was replaced with the additive compound represented by the following formula, with other components being unchanged.

While applying a monochromatic light of 580 nm to the sample from the side of the Al electrode (Pin'=1.55 μw/cm$^2$), photoelectric conversion element of the sample was measured in the same manner as in Example 1 to obtain the following results.

Voc=0.94 V

Jsc=70.3 nA/cm$^2$ ff=0.23

$\eta$=0.98%

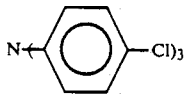

EXAMPLE 4

A sample was prepared in the same manner as in Example 1 except that the additive compound used in Example 1 was replaced with the additive compound represented by the following formula, with other components being unchanged.

While applying a monochromatic light of 580 nm to the sample from the side of the Al electrode (Pin'=1.55 μw/cm$^2$), photoelectric conversion efficiency of the sample was measured in the same manner as in Example 1 to obtain the following results.

Voc=1.01 V

Jsc=61.4 nA/cm$^2$ ff=0.23

$\eta$=0.84%

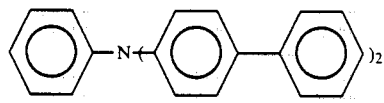

EXAMPLE 5

A sample was prepared in the same manner as in Example 1 except that the azo pigment was replaced with the azo pigment represented by the following formula, without changing the other components than the azo pigment.

While applying a monochromatic light of 600 nm to the sample from the side of the Al electrode (Pin'=1.50 w/cm$^2$), photoelectric conversion efficiency of the sample was measured in the same manner as in Example 1 to obtain the following results.

Voc=0.95 V

Jsc=28.3 nA/cm$^2$ ff=0.24

$\eta$=0.43%

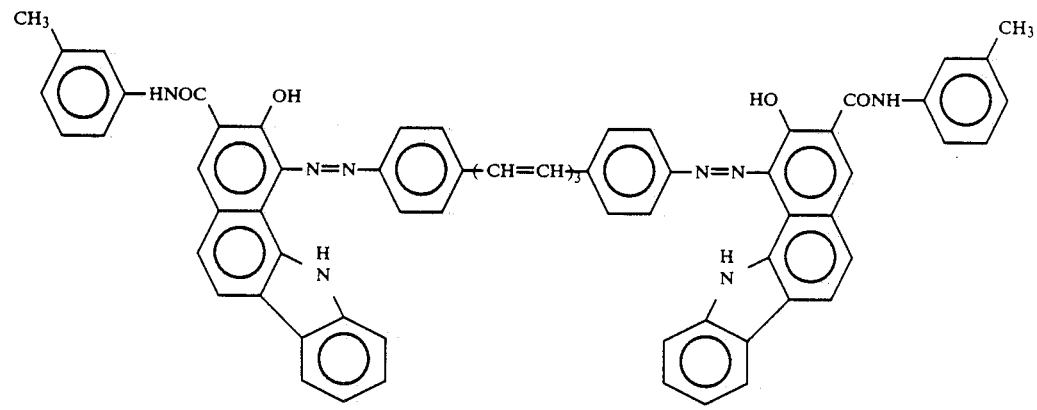

COMPARISON EXAMPLE 2

A sample was prepared in the same manner as in Example 5 except that the additive compound used in Example 5 was omitted. While applying a monochromatic light of 600 nm to the sample from the side of the Al electrode (Pin' = 1.45 μw/cm²), photoelectric conversion efficiency of the sample was measured in the same manner as in Example 1 to obtain the following results.

$V_{oc} = 0.77$ V $J_{sc} = 1.35$ nA/cm²

$ff = 0.25$ $\eta = 0.018\%$

EXAMPLE 6

A sample was prepared in the same manner as in Example 1 with the same additive compound and other component, except that the azo pigment used in Example 1 was substituted by β-type copper phthalocyanine.

While applying a monochromatic light of 620 nm to the sample from the side of the Al electrode (Pin' = 1.5 μw/cm²), photoelectric conversion efficiency of the sample was measured in the same manner as in Example 1 to obtain the following results.

$V_{oc} = 0.82$ V $J_{sc} = 20.5$ nA/cm²

$ff = 0.25$ $\eta = 0.28\%$

COMPARISON EXAMPLE 3

A sample was prepared in the same manner as in Example 6 except that the additive compound used in Example 6 was omitted. While applying a monochromatic light of 620 nm to the sample from the side of the Al electrode (Pin' = 1.5 μw/cm²), photoelectric conversion efficiency of the sample was measured in the same manner as in Example 1 to obtain the following results.

$V_{oc} = 0.72$ V $J_{sc} = 10.4$ nA/cm²

$ff = 0.26$ $\eta = 0.13\%$

EXAMPLE 7

0.8 g of an azo pigment having a chemical structure represented by the following formula was mixed with 8 g of a 5% tetrahydrofuran solution of a butyral resin (XYHL produced by UCC) and the mixture was subjected to ball milling conducted for 3 days. Then, tetrahydrofuran was added to the mixture so that a 1.5 wt% dispersion liquid of the pigment was prepared.

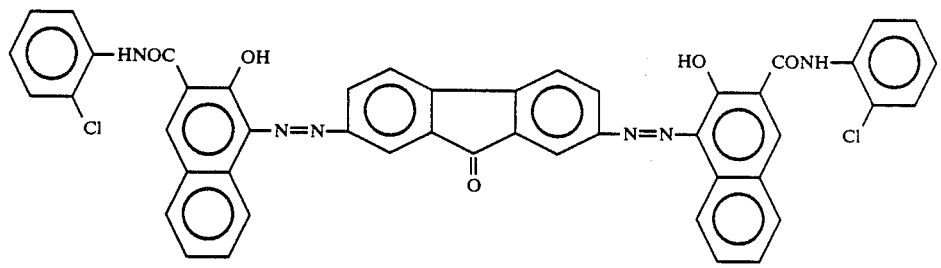

To this dispersion liquid, an additive compound having a structure represented by the following formula was added in the same weight as that of the pigment, and the mixture was stirred to prepare an application liquid.

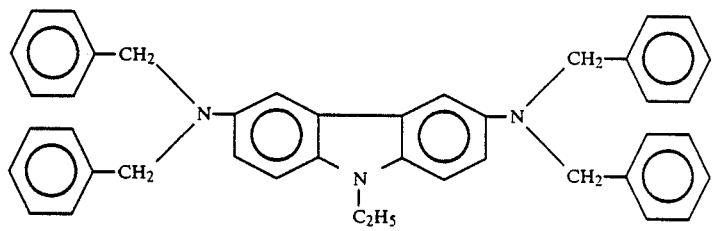

A glass substrate provided with a layer of tin oxide doped with indium (referred to as "ITO" hereinafter) was dipped in the application liquid and raised at a speed of 2 mm/sec, whereby a coating layer was formed on the ITO substrate. A translucent aluminum layer was formed by vacuum evaporation on the coating layer such that the aluminum layer exhibits a light transmittance of about 5.1% at 580 nm. Then, fine copper wires were connected to the ITO substrate and the aluminum layer by means of a silver paste, whereby a sample was obtained.

A monochromatic light having a wavelength of 580 nm was applied to the Al electrode of the sample such that light quantity Pin of 1.55 μw/cm² reaches the pigment dispersed layer, while a lamp wave swept at a rate of 6 mv/sec was applied between both electrodes, and electric current-voltage characteristic of the sample was measured to obtain the following results.

$V_{oc} = 0.92$ V $Jsc = 69.7$ nA/cm$^2$ $ff = 0.20$

The photoelectric conversion efficiency ($\eta$) at 580 nm which was obtained after correction for the transmittance of the Al electrode was 0.827% with respect to the sample.

COMPARISON EXAMPLE 4

A pigment dispersion layer was prepared in the same manner as in Example 7 except that the additive compound used in Example 7 was omitted, and a translucent aluminum layer was formed by vacuum evaporation so that the aluminum layer exhibits a light transmittance of 7.7% at 580 nm. While applying a monochromatic light of 580 nm to the sample from the side of the ITO electrode (Pin' = 1.6 $\mu$w/cm$^2$), photoelectric conversion efficiency of the sample was measured in the same manner as in Example 7 to obtain the following results.

$Voc = 0.74$ V $Jsc = 2.50$ nA/cm$^2$ $ff = 0.22$ $\eta = 0.026\%$

EXAMPLE 8

A pigment dispersion liquid was prepared in the same manner as in Example 7 except that the azo pigment used in Example 7 was replaced with the azo pigment represented by the following formula, and the same additive compound as that used in Example 7 was dissolved in this pigment dispersion liquid so as to form an application liquid. The liquid was applied to the substrate to form a pigment dispersion layer containing the additive compound.

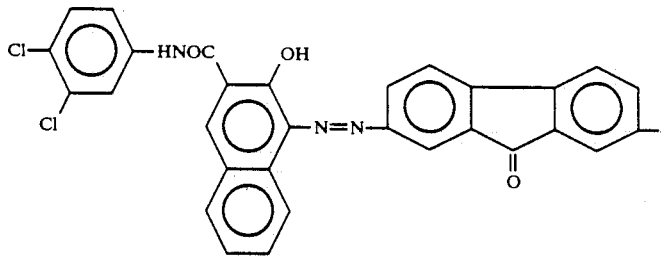

A translucent aluminum layer was vacuum evaporated onto the dispersion layer such that the light transmittance at 560 nm was 4.2%, thus preparing a sample.

While applying a monochromatic light of 560 nm to the sample from the side of the Al electrode (Pin' = 1.6 $\mu$w/cm$^2$), photoelectric conversion efficiency of the sample was measured in the same manner as in Example 7 to obtain the following results.

$Voc = 0.85$ V $Jsc = 34.7$ nA/cm$^2$ $ff = 0.13$ $\eta = 0.230\%$

COMPARISON EXAMPLE 5

A pigment dispersion layer was prepared in the same manner as in Example 8 except that the additive compound used in Example 8 was omitted, and translucent aluminum layer was formed by vacuum evaporation on the pigment dispersion layer such that light transmittance of 7.2% was obtained at 560 nm.

While applying a monochromatic light of 560 nm to the sample from the side of the Al electrode (Pin' = 1.6 $\mu$w/cm$^2$), photoelectric conversion efficiency of the sample was measured in the same manner as in Example 7 to obtain the following results.

$Voc = 0.61$ V $Jsc = 4.80$ nA/cm$^2$ $ff = 0.20$ $\eta = 0.035\%$

EXAMPLE 9

A sample was prepared in the same manner as in Example 7 except that the additive compound used in Example 7 was replaced with the compound represented by the following formula, without changing other components.

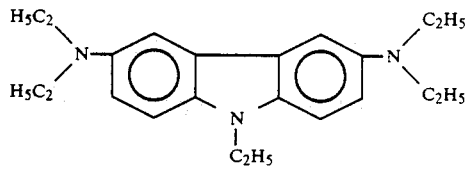

While applying a monochromatic light of 580 nm to the sample through the Al electrode (Pin' = 1.55 $\mu$w/cm$^2$), photoelectric conversion efficiency of the sample was measured in the same manner as in Example 7 to obtain the following results.

$Voc = 0.88$ V $Jsc = 16.1$ nA/cm$^2$ $ff = 0.23$ $\eta = 0.21\%$

EXAMPLE 10

A sample was prepared in the same manner as in Example 7 except that the additive compound used in Example 7 was replaced with the compound represented by the following formula, with other components being unchanged.

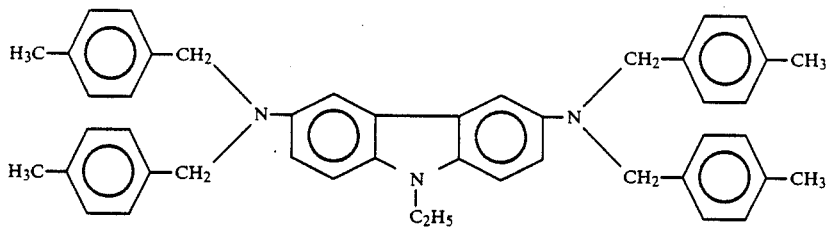

While applying a monochromatic light of 580 nm through the Al electrode (Pin′=1.55 μw/cm²), photoelectric conversion efficiency of the sample was measured in the same manner as in Example 7 to obtain the following results.

Voc=0.90 V

Jsc=66.3 nA/cm² ff=0.20

η=0.77%

EXAMPLE 11

A sample was prepared in the same manner as in Example 7 with the same additive compound and other component as in Example 7 except that the azo pigment used in Example 7 was substituted by β-type copper phthalocyanine. While applying a monochromatic light of 620 nm to the sample from the side of the Al electrode (Pin′=1.5 μw/cm²), photoelectric conversion efficiency of the sample was measured in the same manner as in Example 7 to obtain the following results.

Voc=0.94 V

Jsc=21.8 nA/cm² ff=0.22

η=0.30%

COMPARISON EXAMPLE 6

A sample was prepared in the same manner as in Example 11 except that the additive compound used in Example 11 was omitted. While applying a monochromatic light of 620 nm to the sample from the side of the Al electrode (Pin′=1.5 μw/cm²), photoelectric conversion efficiency of the sample was measured in the same manner as in Example 7 to obtain the following results.

Voc=0.72 V

Jsc=10.4 nA/cm² ff=0.26

η=0.13%

EXAMPLE 12

0.8 g of an azo pigment having a chemical structure represented by the following formula was mixed with 8 g of a 5% tetrahydrofuran solution of a butyral resin (XYHL produced by UCC) and the mixture was subjected to ball milling conducted for 3 days. Then, tetrahydrofuran was added to the mixture so that a 1.5 wt% solution of the azo pigment was prepared.

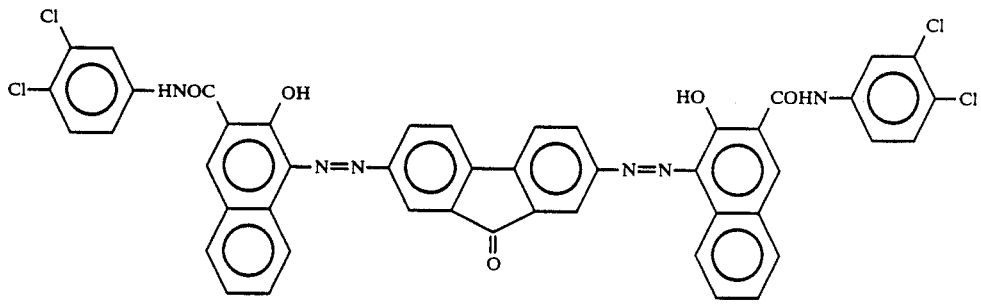

To this solution, an additive compound having a structure represented by the following formula was added in the same weight as that of the pigment, and the mixture was stirred to prepare an application liquid.

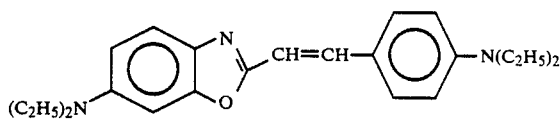

A glass substrate provided with a layer of tin oxide doped with indium (referred to as "ITO" hereinafter) was dipped in the application liquid and raised at a speed of 2 mm/sec, whereby a coating layer was formed on the ITO substrate. A translucent aluminum layer was formed by vacuum evaporation on the coating layer such that the aluminum layer exhibits a light transmittance of 5.8% at 560 nm. Then, fine copper wires were connected to the ITO substrate and the aluminum layer by means of a silver paste, whereby a sample was obtained.

A monochromatic light having a wavelength of 560 nm was applied to the sample from the side of the Al electrode such that light quantity Pin' of 1.6 μw/cm² reaches the pigment dispersed layer, while a lamp wave swept at a rate of 6 mv/sec was applied between both electrodes, and electric current-voltage characteristic of the sample was measured to obtain the following results.

Voc=0.97 V

Jsc=54.7 nA/cm² ff=0.19

The photoelectric conversion efficiency (η) at 560 nm which was obtained after correction for the transmittance of the Al electrode was 0.63% with respect to the sample.

EXAMPLE 13

A sample was prepared in the same manner as in Example 12 except that the additive compound used in Example 12 was replaced with the compound represented by the following formula, with other components being unchanged.

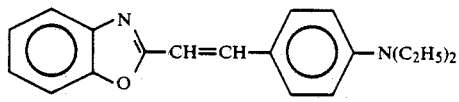

While applying a monochromatic light of 560 nm to the sample from the side of the Al electrode (Pin'=1.6 μw/cm²), photoelectric conversion efficiency of the sample was measured in the same manner as in Example 12 to obtain the following results.

Voc=0.97 V

Jsc=43.4 nA/cm² ff=0.19

η=0.50%

EXAMPLE 14

A sample was prepared in the same manner as in Example 12 except that the additive compound used in Example 12 was replaced with the compound represented by the following formula, with other components being unchanged.

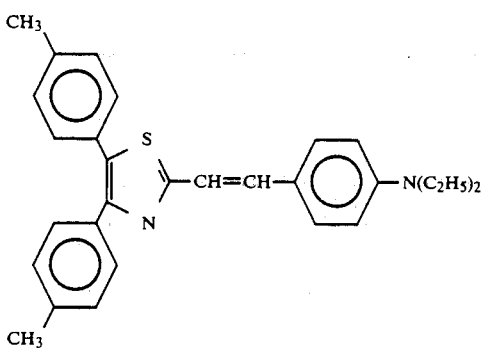

While applying a monochromatic light of 560 nm to the sample from the side of the Al electrode (Pin'=1.6 μw/cm²), photoelectric conversion efficiency of the sample was measured in the same manner as in Example 12 to obtain the following results.

Voc=0.90 V

Jsc=56.0 nA/cm² ff=0.20

η=0.63%

EXAMPLE 15

A sample was prepared in the same manner as in Example 12 except that the additive compound used in Example 12 was replaced with the compound represented by the following formula, with other components being unchanged.

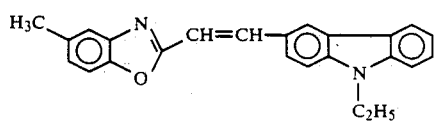

While applying a monochromatic light of 560 nm to the sample from the side of the Al electrode (Pin'=1.6 μw/cm²), photoelectric conversion efficiency of the sample was measured in the same manner as in Example 12 to obtain the following results.

Voc=0.98 V

Jsc=13.1 nA/cm² ff=0.20

η=0.16%

EXAMPLE 16

A sample was prepared in the same manner as in Example 12 except that the additive compound used in Example 12 was replaced with the compound represented by the following formula, with other components being unchanged.

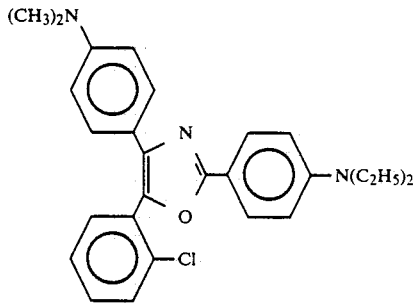

While applying a monochromatic light of 560 nm to the sample from the side of the Al electrode (Pin'=1/6 μw/cm²), photoelectric conversion efficiency of the sample was measured in the same manner as in Example 12 to obtain the following results.

Voc=0.98 V

Jsc=52.6 nA/cm² ff=0.18

η=0.58%

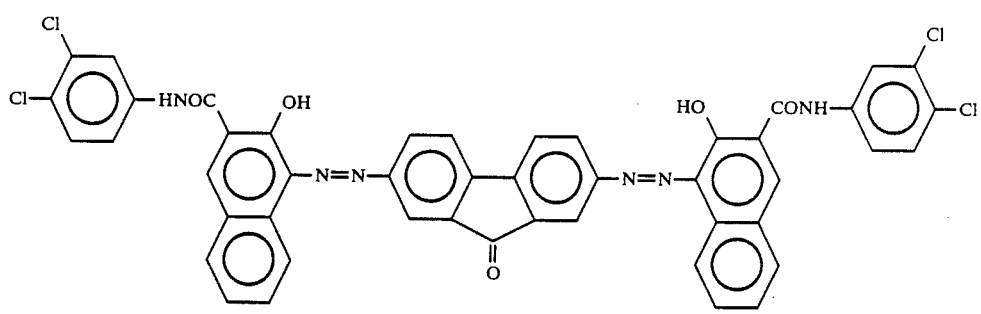

EXAMPLE 17

A sample was prepared in the same manner as in Example 12 except that the additive compound used in Example 12 was replaced with the compound represented by the following formula, with other components being unchanged.

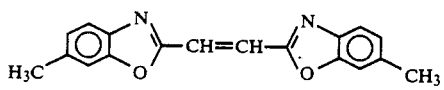

While applying a monochromatic light of 560 nm to the sample from the side of the Al electrode (Pin'=1.6 μw/cm$^2$), photoelectric conversion efficiency of the sample was measured in the same manner as in Example 12 to obtain the following results.

Voc=0.94 V

Jsc=6.0 nA/cm$^2$ ff=0.23

η=0.081%

EXAMPLE 18

A sample was prepared in the same manner as in Example 12 except that the azo pigment used in Example 12 was replaced with β-type copper phthalocyanine, with the additive compound and other component being unchanged.

While applying a monochromatic light of 560 nm to the sample from the side of the Al electrode (Pin'=1.5 μw/cm$^2$), photoelectric conversion efficiency of the sample was measured in the same manner as in Example 12 to obtain the following results.

Voc=0.93 V

Jsc=45.2 nA/cm$^2$ ff=0.20

η=0.56%

EXAMPLE 19

0.8 g of an azo pigment having a chemical construction represented by the following formula was mixed with 8 g of a 5% tetrahydrofuran solution of a butyral resin (XYHL produced by UCC) and the mixture was subjected to ball milling conducted for 3 days. Then, tetrahydrofuran was added to the mixture so that a 1.5 wt% solution of the azo pigment was prepared.

To this solution, an additive compound having a structure represented by the following formula was added in the same weight as that of the pigment, and the mixture was stirred to prepare an application liquid.

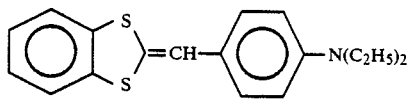

A glass substrate provided with a layer of tin oxide doped with indium (referred to as "ITO" hereinafter) was dipped in the application liquid and raised at a speed of 2 mm/sec, whereby a coating layer was formed on the ITO substrate. A translucent aluminum layer was formed by vacuum evaporation on the coating layer such that the aluminum layer exhibits a light transmittance of 6.2% at 560 nm. Then, fine copper wires were connected to the ITO substrate and the aluminum layer by means of a silver paste, whereby a sample was obtained.

A monochromatic light having a wavelength of 560 nm was applied to the sample from the side of the Al electrode such that light quantity Pin'of 1.6 μw/cm$^2$ reaches the pigment dispersed layer, while a lamp wave swept at a rate of 6 mv/sec was applied between both electrodes, and electric current-voltage characteristic of the sample was measured to obtain the following results.

Voc=0.94 V

Jsc=71.1 nA/cm$^2$ ff=0.17

The photoelectric conversion efficiency (η) at 560 nm which was obtained after correction for the transmittance of the Al electrode was 0.71% with respect to the sample.

EXAMPLE 20

A sample was prepared in the same manner as in Example 19 except that the additive compound used in Example 19 was replaced with the compound represented by the following formula, with other components being unchanged.

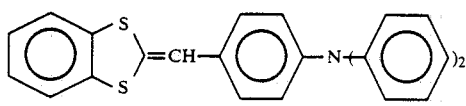

While applying a monochromatic light of 560 nm to the sample from the side of the Al electrode (Pin'=1.6 μw/cm$^2$), photoelectric conversion efficiency of the sample was measured in the same manner as in Example 19 to obtain the following results.

Voc=0.96 V

Jsc=87.5 nA/cm$^2$ ff=0.16

η=0.84%

EXAMPLE 21

A sample was prepared in the same manner as in Example 19 except that the additive compound used in Example 19 was replaced with the compound represented by the following formula, with other components being unchanged.

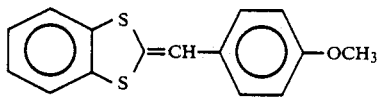

While applying a monochromatic light of 560 nm to the sample from the side of the A1 electrode (Pin'=1.6 μw/cm$^2$), photoelectric conversion efficiency of the sample was measured in the same manner as in Example 19 to obtain the following results.

Voc=0.94 V

Jsc=34.0 nA/cm$^2$ ff=0.20

η=0.40%

EXAMPLE 22

A sample was prepared in the same manner as in Example 19 except that the additive compound used in Example 19 was replaced with the compound represented by the following formula, with other components being unchanged.

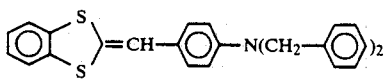

While applying a monochromatic light of 560 nm to the sample from the side of the Al electrode (Pin'=1.6 μw/cm$^2$), photoelectric conversion efficiency of the sample was measured in the same manner as in Example 19 to obtain the following results.

Voc=0.94 V

Jsc=66.1 nA/cm$^2$ ff=0.17

η=0.66%

EXAMPLE 23

A sample was prepared in the same manner as in Example 19 except that the additive compound used in Example 19 was replaced with the compound represented by the following formula, with other components being unchanged.

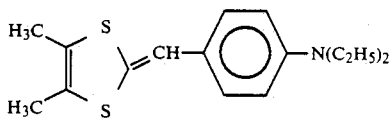

While applying a monochromatic light of 560 nm to the sample from the side of the Al electrode (Pin'=1.6 μw/cm$^2$), photoelectric conversion efficiency of the sample was measured in the same manner as in Example 19 to obtain the following results.

Voc=0.96 V

Jsc=55.9 nA/cm$^2$ ff=0.17

η=0.57%

EXAMPLE 24

A sample was prepared in the same manner as in Example 19 except that the additive compound used in Example 19 was replaced with the compound represented by the following formula, with other components being unchanged.

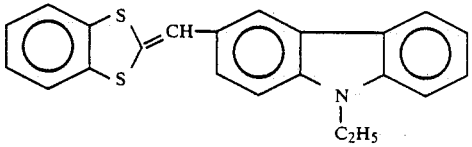

While applying a monochromatic light of 560 nm to the sample from the side of the Al electrode (Pin'=1.6 μw/cm$^2$), photoelectric conversion efficiency of the sample was measured in the same manner as in Example 19 to obtain the following results.

Voc=0.89 V

Jsc=48.9 nA/cm$^2$ ff=0.18

η=0.49%

EXAMPLE 25

A sample was prepared in the same manner as in Example 19 except that the azo pigment used in Example 19 was replaced with β-type copper phthalocyanine, with the additive compound and other component being unchanged.

While applying a monochromatic light of 620 nm to the sample from the side of the A1 electrode (Pin'=1.5 μw/cm²), photoelectric conversion efficiency of the sample was measured in the same manner as in Example 19 to obtain the following results.

Voc=0.94 V

Jsc=61.6 nA/cm² ff=0.21

η=0.81%

What is claimed is:

1. A photoelectric conversion element comprising a light-permeable front electrode, a photo-activatable layer disposed on one surface of said front electrode, and a rear electrode disposed on one surface of said photo-activatable layer opposite said front electrode,
wherein said photo-activatable layer contains 5 to 50 by weight of a triphenyl amine compound represented by the general formula (I):

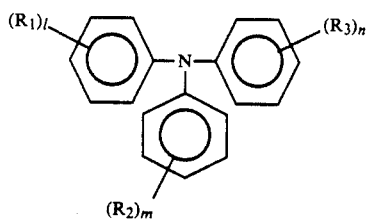
(I)

in which $R_1$, $R_2$, and $R_3$ represent a halogen atom, a nitro group, a cyano group, a substituted or non-substituted alkyl group, a substituted or non-substituted alkoxy group, a substituted or non-substituted aryl group, a substituted or non-substituted phenoxy group or a substituted or non-substituted amino group, respectively, and l, m and n represent 0, 1, 2 or 3, respectively,
30 to 90% by weight of a light absorptive photoconductive organic semiconductor material, and 0 to 50% by weight of binder.

2. A photoelectric conversion element according to claim 1, in which said triphenyl amine compound represented by the general formula (I) is a compound selected from the group consisting of compounds represented by the following formulae (4), (5), (6) and (7):

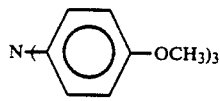
(4)

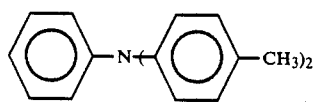
(5)

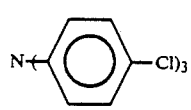
(6)

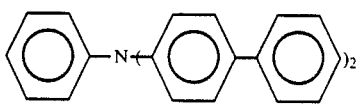
(7)

3. A photoelectric conversion element according to claim 1, in which said photo-activatable layer contains 10 to 40% by weight of the triphenyl amine compound represented by the general formula (I), 40 to 70% by weight of the light absorptive photoconductive organic semiconductor material, and 10 to 40% by weight of the binder.

4. A photoelectric conversion element comprising a light-permeable front electrode, a photo-activatable layer disposed on one surface of said front electrode, and a rear electrode disposed on one surface of said photo-activatable layer opposite said front electrode, wherein said photo-activatable layer contains 5 to 50% by weight of a diaminocarbazole compound represented by the general formula (II):

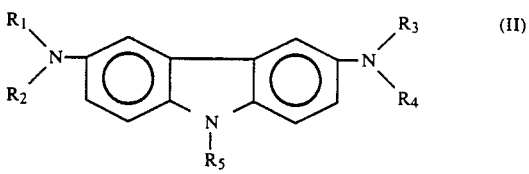
(II)

in which $R_1$, $R_2$, $R_3$, $R_4$ and $R_5$ represent a hydrogen atom, a substituted or non-substituted alkyl group or a substituted or non-substituted aryl group, respectively, wherein $R_1$, $R_2$, $R_3$, $R_4$ and $R_5$ may be the same as or different from one another,
30 to 90% by weight of a light absorptive photoconductive organic semiconductor material, and 0 to 50% by weight of a binder.

5. A photoelectric conversion element according to claim 4, in which said diaminocarbazole compound represented by the general formula (II) is a compound selected from the group consisting of compounds represented by the following formulae (8), (9) and (10):

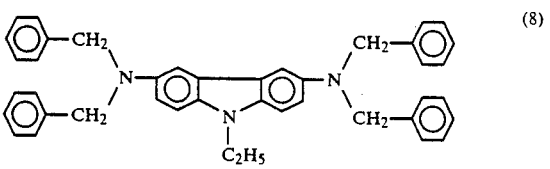
(8)

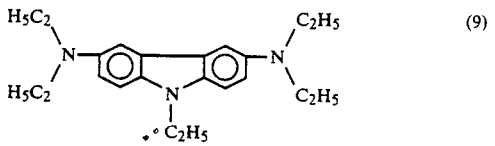
(9)

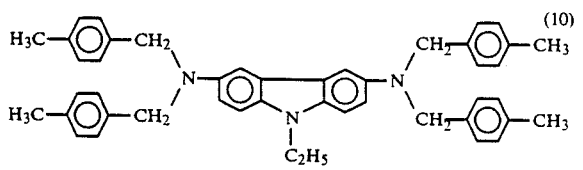
(10)

6. A photoelectric conversion element according to claim 4, in which said photo-activatable layer contains 10 to 40% by weight of the diaminocarbazole compound represented by the general formula (II), 40 to 70% by weight of the light absorptive photoconductive organic semiconductor material, and 10 to 40% by weight of the binder.

7. A photoelectric conversion element comprising a light-permeable front electrode, a photo-activatable layer disposed on one surface of said front electrode, and a rear electrode disposed on one surface of said photo-activatable layer opposite said front electrode, wherein said photo-activatable layer contains 5 to 50% by weight of a compound represented by the general formula (III):

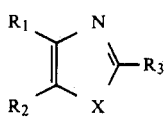
(III)

in which $R_1$, $R_2$ and $R_3$ represent a hydrogen atom, a substituted or non-substituted alkyl group which is saturated or unsaturated, a substituted or non-substituted alkoxy group, a substituted or non-substituted aryl group or a substituted or non-substituted heterocyclic ring group, respectively, wherein $R_1$ and $R_2$ may form a ring, and X represents a sulfur atom or on oxygen atoms, 30 to 90% by weight of a light absorptive photoconductive organic semiconductor material, and 0 to 50% by weight of a binder.

8. A photoelectric conversion element according to claim 7, in which said compound represented by the general formula (III) is a compound selected from the group consisting of compounds represented by the following formulae (11), (12), (13), (14), (15) and (16):

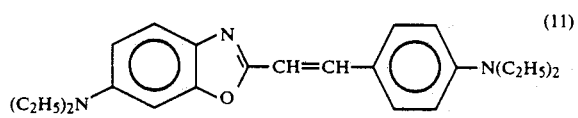
(11)

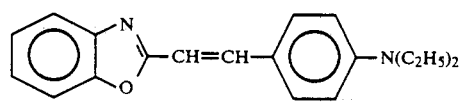
(12)

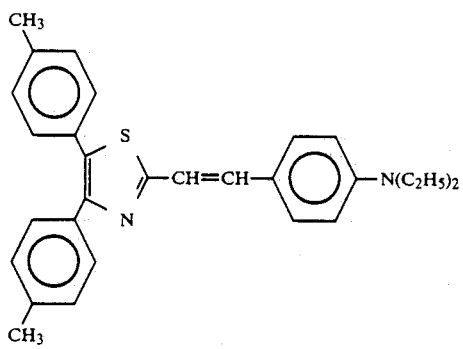
(13)

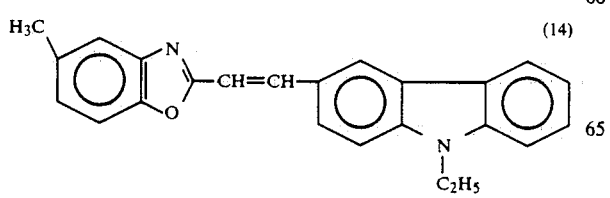
(14)

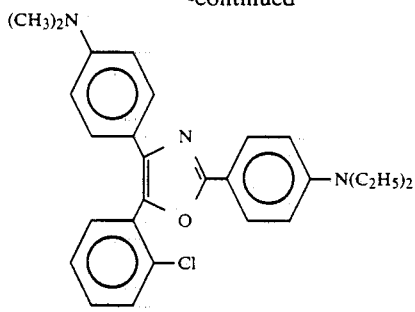
(15)

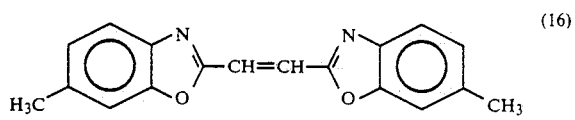
(16)

9. A photoelectric conversion element according to claim 7, in which said photo-activatable layer contains 10 to 40% by weight of the compound expressed by the general formula (III), 40 to 70% by weight of the light absorptive photoconductive organic semiconductor material, and 10 to 40% by weight of the binder.

10. A photoelectric conversion element comprising a light-permeable front electrode, a photo-activatable layer disposed on one surface of said front electrode, and a rear electrode disposed on one surface of said photo-activatable layer opposite said front electrode, wherein said photo-activatable layer contains 5 to 60% by weight of a 1,3-dithiol compound represented by the general formula (IV):

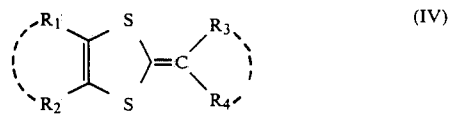
(IV)

in which $R_1$, $R_2$, $R_3$ and $R_4$ represent a hydrogen atom, a halogen atom, a cyano group, a nitro group, a substituted or non-substituted alkyl group which is saturated or unsaturated, a substituted or non-substituted alkoxy group, substituted or non-substituted aryl group, or a substituted or non-substituted heterocyclic ring group, respectively, wherein $R_1$ and $R_2$, and $R_3$ and $R_4$ may respectively form rings, 20 to 90% by weight of a light absorption photoconductive organic semiconductor material, and 0 to 50% by weight of a binder.

11. A photoelectric conversion element according to claim 10, in which said 1,3-dithiol compound represented by the general formula (IV) is a compound selected from the group consisting of compounds represented by the following formulae (17), (18), (19), (20), (21) and (22):

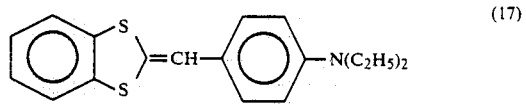
(17)

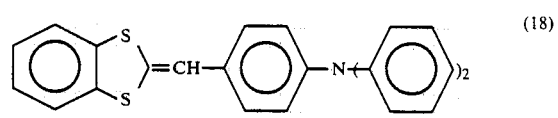
(18)

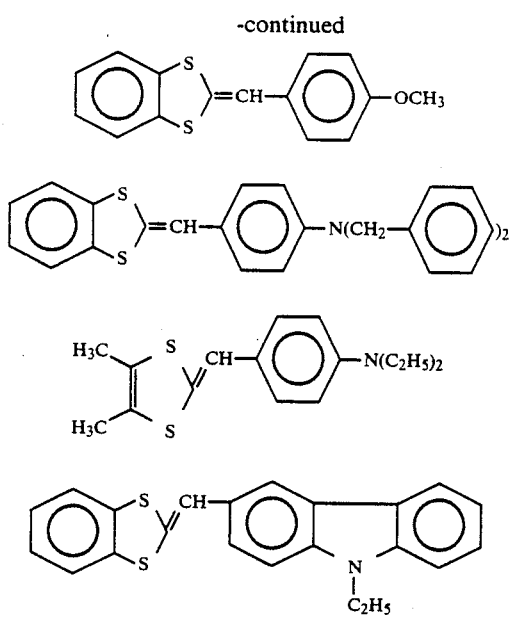

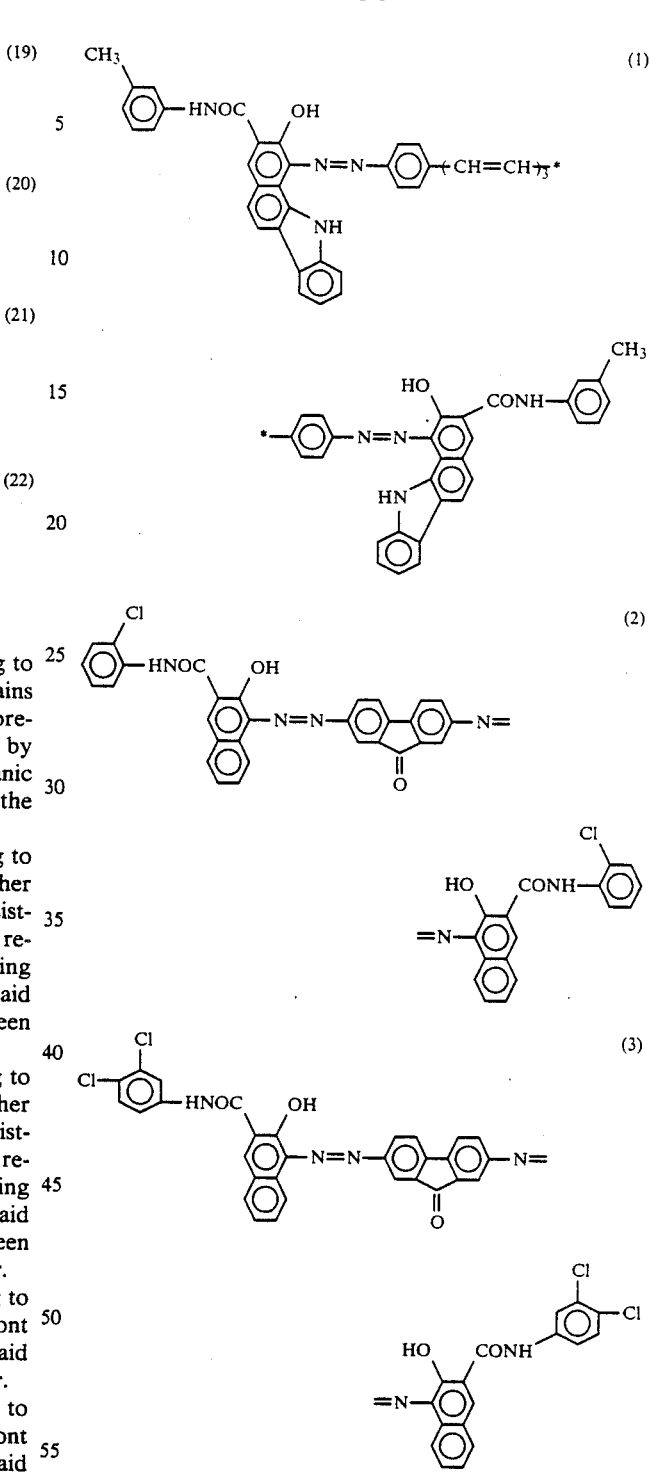

12. A photoelectric conversion element according to claim 10, in which said photo-activatable layer contains 10 to 50% by weight of the 1,3-dithiol compound represented by the general formula (IV), 40 to 70% by weight of the light absorption photoconductive organic semiconductor material, and 10 to 40% by weight of the binder.

13. A photoelectric conversion element according to any one of claims 1 to 10, further comprising another photo-activatable layer selected from the group consisting of a layer capable of generating charges upon receiving light and a layer capable of efficiently moving charges generated in said photo-activatable layer, said another photo-activatable layer being disposed between said rear electrode and said photo-activatable layer.

14. A photoelectric conversion element according to any one of claims 1 to 10, further comprising another photo-activatable layer selected from the group consisting of a layer capable of generating charges upon receiving light and a layer capable of efficiently moving charges generated in said photo-activatable layer, said another photo-activatable layer being disposed between said front electrode and said photo-activatable layer.

15. A photoelectric conversion element according to any one of claims 1 to 10, further comprising a front electrode support layer disposed on one surface of said front electrode opposite said photo-activatable layer.

16. A photoelectric conversion element according to any one of claims 1 to 10, further comprising a front electrode support layer disposed on one surface of said front electrode opposite said photo-activatable layer and a rear electrode support layer disposed on one surface of said rear electrode opposite said photo-activatable layer.

17. A photoelectric conversion element according to any one of claims 1 to 10, in which said photo-activatable layer has a thickness of 0.01 to 10 μm.

18. A photoelectric conversion element according to any one of claims 1 to 10, in which said light absorptive photoconductive semiconductor material is a compound selected from the group consisting of compounds represented by the following formulae (1), (2) and (3):

19. A photoelectric conversion element according to any one of claims 1 to 10, in which said front electrode is made of a translucent metal selected from the group consisting of aluminum, lead, zinc, tantalum, nickel, titanium, cobalt, niobium, copper, Hastelloy C, gold, platinum, silver and palladium, or of a translucent metal oxide selected from the group consisting of tin oxide and tin oxide doped with indium.

20. A photoelectric conversion element according to any one of claims 1 to 10, in which said rear electrode is made of a metal layer.

21. A photoelectric conversion element according to any one of claims 1 to 10, in which said binder is a synthetic resin.

22. A photoelectric conversion element comprising a light-permeable front electrode, a photo-activatable layer disposed on one surface of said front electrode, and a rear electrode disposed on one surface of said photo-activatable layer opposite said front electrode, wherein said photo-activatable layer contains a compound selected from a group consisting of a triphenylamine compound represented by the following general formula (I):

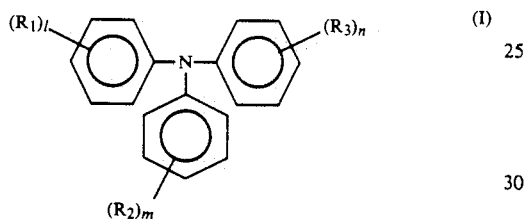

in which $R_1$, $R_2$, and $R_3$ represent a halogen atom, a nitro group, a cyano group, a substituted or non-substituted alkyl group, a substituted or non-substituted alkoxy group, a substituted or non-substituted aryl group, a substituted or non-substituted phenoxy group or a substituted or non-substituted amino group, respectively, and l, m and n represent 0, 1, 2 or 3, respectively, a diaminocarbazole compound represented by the following general formula (II):

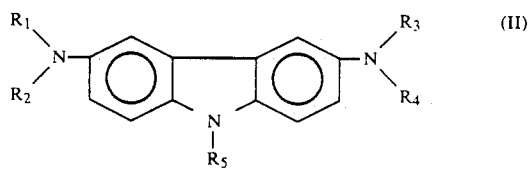

in which $R_1$, $R_2$, $R_3$, $R_4$ and $R_5$ represent a hydrogen atom, a substituted or non-substituted alkyl group or a substituted or non-substituted aryl group, respectively, wherein $R_1$, $R_2$, $R_3$, $R_4$ and $R_5$ may be the same as or different from one another, a compound represented by the following general formula (III):

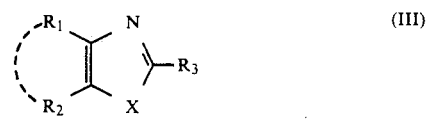

in which $R_1$, $R_2$ and $R_3$ represent a hydrogen atom, a substituted or non-substituted alkyl group which is saturated or unsaturated, a substituted or non-substituted alkoxy group, a substituted or non-substituted aryl group or a substituted or non-substituted heterocyclic ring group, respectively, wherein $R_1$ and $R_2$ may form a ring, and X represents a sulfur atom or on oxygen atom, and a 1,3-dithiol compound represented by the following general formula (IV):

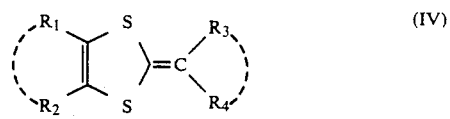

in which $R_1$, $R_2$, $R_3$ and $R_4$ represent a hydrogen atom, a halogen atom, a cyano group, a nitro group, a substituted or non-substituted alkyl group which is saturated or unsaturated, a substituted or non-substituted alkoxy group, substituted or non-substituted aryl group, or a substituted or non-substituted heterocyclic ring group, respectively, wherein $R_1$ and $R_2$, and $R_3$ and $R_4$ may respectively form rings.

* * * * *

UNITED STATES PATENT AND TRADEMARK OFFICE
CERTIFICATE OF CORRECTION

PATENT NO.  : 4,992,109

DATED       : February 12, 1991

INVENTOR(S) : MASAO YOSHIKAWA, TETSURO SUZUKI, AKIO KOJIMA,
              MASAYUKI SHOSHI and MASAFUMI OHTA It is certified that error appears in the above-identified patent and that said Letters Patent is hereby corrected as shown below:

Column 49, line 21, after "50" insert --%--; line 46, after "of" insert --a--. Column 51, line 15, change

Column 51, line 26, change "on" to --an--; line 27, change "atoms" to --atom--. Column 52, line 49, change "absorption" to --absorptive--. Column 53, line 29, change "absorption" to --absorptive--. Column 55, line 17, change "a group" to --the group--. Column 56, line 30, change "on" to --an--.

Signed and Sealed this

Thirteenth Day of October, 1992

Attest:

DOUGLAS B. COMER

Attesting Officer

Acting Commissioner of Patents and Trademarks